US012811572B2

(12) United States Patent
Cohen et al.

(10) Patent No.: US 12,811,572 B2
(45) Date of Patent: Nov. 24, 2026

(54) QUANTUM CONTROLLER WITH MULTIPLE PULSE MODES

(71) Applicant: Q.M Technologies Ltd., Tel Aviv-Jaffa (IL)

(72) Inventors: Yonatan Cohen, Tel Aviv-Jaffa (IL); Nissim Ofek, Tel Aviv-Jaffa (IL); Itamar Sivan, Tel Aviv-Jaffa (IL)

(73) Assignee: Q.M Technologies Ltd. (IL)

( * ) Notice: Subject to any disclaimer, the term of this patent is extended or adjusted under 35 U.S.C. 154(b) by 87 days.

(21) Appl. No.: 19/055,070

(22) Filed: Feb. 17, 2025

(65) Prior Publication Data

US 2025/0192760 A1 Jun. 12, 2025

Related U.S. Application Data

(63) Continuation of application No. 18/359,944, filed on Jul. 27, 2023, now Pat. No. 12,255,652, which is a (Continued)

(51) Int. Cl.

*H03K 3/38* (2006.01)
*G06N 10/40* (2022.01)
*G06N 10/60* (2022.01)
*G06N 10/80* (2022.01)
*H03K 19/195* (2006.01)

(52) U.S. Cl.

CPC ............... *H03K 3/38* (2013.01); *G06N 10/40* (2022.01); *G06N 10/60* (2022.01); *G06N 10/80* (2022.01); *H03K 19/195* (2013.01)

(58) Field of Classification Search

CPC ........ H03K 3/38; H03K 19/195; G06N 10/40; G06N 10/60; G06N 10/80

See application file for complete search history.

(56) References Cited

U.S. PATENT DOCUMENTS

| | | | |
|---|---|---|---|
| 4,875,484 | A | 10/1989 | Anzai et al. |
| 5,063,354 | A | 11/1991 | Lauper et al. |

(Continued)

FOREIGN PATENT DOCUMENTS

| | | | |
|---|---|---|---|
| CA | 2420022 | A1 | 2/2003 |
| CN | 1808103 | A | 7/2006 |

(Continued)

OTHER PUBLICATIONS

U.S. Appl. No. 62/294,966, filed Feb. 12, 2016.

(Continued)

*Primary Examiner* — Daniel D Chang

(74) *Attorney, Agent, or Firm* — McAndrews, Held & Malloy, Ltd.

(57) ABSTRACT

A system comprises an electromagnetic pulse generation system that comprises a first pulse generation circuit, a second pulse generation circuit, and a mixing circuit. The electromagnetic pulse generation system is operable to output a first pulse generated by the first pulse generation circuit onto a first signal path, output a second pulse generated by the second pulse generation circuit onto the first signal path, generate a third pulse by mixing, via the mixing circuit, a fourth pulse generated by the first pulse generation circuit and a fifth pulse generated by the second pulse generation circuit, and output the third pulse on the first signal path.

20 Claims, 12 Drawing Sheets

Related U.S. Application Data continuation of application No. 17/725,829, filed on Apr. 21, 2022, now Pat. No. 11,736,096, which is a continuation of application No. 17/207,827, filed on Mar. 22, 2021, now Pat. No. 11,342,905, which is a continuation of application No. 15/931,644, filed on May 14, 2020, now Pat. No. 10,985,739, which is a continuation of application No. 16/659,599, filed on Oct. 22, 2019, now Pat. No. 10,659,018, which is a continuation of application No. 16/247,115, filed on Jan. 14, 2019, now Pat. No. 10,454,459.

(56) References Cited

U.S. PATENT DOCUMENTS

| | | | | |
|---|---|---|---|---|
| 5,194,907 | A | 3/1993 | Hayashi | |
| 6,223,228 | B1 | 4/2001 | Ryan et al. | |
| 6,426,984 | B1 | 7/2002 | Perino et al. | |
| 6,993,108 | B1 | 1/2006 | Chi et al. | |
| 7,451,292 | B2 | 11/2008 | Routt | |
| 7,535,931 | B1 | 5/2009 | Zampetti et al. | |
| 7,627,126 | B1 | 12/2009 | Pikalo | |
| 8,315,969 | B2 | 11/2012 | Roetteler | |
| 8,385,878 | B2 | 2/2013 | Rao | |
| 8,750,717 | B1 | 6/2014 | Yap et al. | |
| 9,207,672 | B2 | 12/2015 | Williams | |
| 9,400,499 | B2 | 7/2016 | Williams | |
| 9,509,324 | B2 | 11/2016 | McDonald et al. | |
| 9,663,358 | B1 | 5/2017 | Cory et al. | |
| 9,692,423 | B2 | 6/2017 | McDermott, III | |
| 9,847,121 | B2 | 12/2017 | Frank | |
| 9,858,531 | B1* | 1/2018 | Monroe | G06F 15/76 |
| 9,892,365 | B2 | 2/2018 | Rigetti | |
| 9,978,020 | B1 | 5/2018 | Gambetta | |
| 9,979,400 | B1 | 5/2018 | Sete | |
| 9,996,801 | B2 | 6/2018 | Shim | |
| 10,063,228 | B2 | 8/2018 | Deurloo et al. | |
| 10,122,351 | B1 | 11/2018 | Naaman | |
| 10,127,499 | B1 | 11/2018 | Rigetti | |
| 10,192,168 | B2 | 1/2019 | Rigetti | |
| 10,223,643 | B1 | 3/2019 | Bishop et al. | |
| 10,333,503 | B1 | 6/2019 | Cohen et al. | |
| 10,454,459 | B1 | 10/2019 | Cohen | |
| 10,496,069 | B2 | 12/2019 | Nazarathy et al. | |
| 10,505,524 | B1 | 12/2019 | Cohen | |
| 10,560,076 | B1 | 2/2020 | Cohen | |
| 10,637,449 | B1 | 4/2020 | Cohen et al. | |
| 10,659,018 | B1 | 5/2020 | Cohen | |
| 10,666,238 | B1 | 5/2020 | Cohen | |
| 10,958,253 | B1 | 3/2021 | Cohen et al. | |
| 10,985,739 | B2 | 4/2021 | Cohen et al. | |
| 11,010,145 | B1 | 5/2021 | Smith et al. | |
| 11,463,075 | B2 | 10/2022 | Cohen et al. | |
| 11,616,497 | B2 | 3/2023 | Cohen et al. | |
| 11,616,498 | B2 | 3/2023 | Cohen et al. | |
| 2002/0004876 | A1 | 1/2002 | Timmer et al. | |
| 2004/0266084 | A1 | 12/2004 | Fujishima et al. | |
| 2005/0015422 | A1 | 1/2005 | Kohn et al. | |
| 2005/0180575 | A1 | 8/2005 | Maeda et al. | |
| 2006/0093376 | A1 | 5/2006 | Mitchell et al. | |
| 2008/0037693 | A1 | 2/2008 | Andrus et al. | |
| 2009/0268901 | A1 | 10/2009 | Lodewyck et al. | |
| 2010/0072979 | A1 | 3/2010 | Fefer et al. | |
| 2011/0035511 | A1 | 2/2011 | Biederman | |
| 2013/0198499 | A1 | 8/2013 | Dice et al. | |
| 2016/0125311 | A1 | 5/2016 | Fuechsle et al. | |
| 2016/0267032 | A1* | 9/2016 | Rigetti | G06F 13/36 |
| 2016/0292586 | A1 | 10/2016 | Rigetti et al. | |
| 2017/0094618 | A1 | 3/2017 | Bjorkengren | |
| 2017/0214410 | A1 | 7/2017 | Hincks et al. | |
| 2017/0364796 | A1 | 12/2017 | Wiebe | |
| 2018/0013426 | A1 | 1/2018 | Deurloo et al. | |
| 2018/0032893 | A1 | 2/2018 | Epstein | |
| 2018/0091244 | A1 | 3/2018 | Abdo | |
| 2018/0107579 | A1 | 4/2018 | Chapman | |
| 2018/0123597 | A1 | 5/2018 | Sete | |
| 2018/0237039 | A1 | 8/2018 | Mong et al. | |
| 2018/0260245 | A1 | 9/2018 | Smith | |
| 2018/0260730 | A1 | 9/2018 | Reagor | |
| 2018/0260732 | A1 | 9/2018 | Bloom | |
| 2018/0308007 | A1 | 10/2018 | Amin | |
| 2018/0322409 | A1 | 11/2018 | Barends | |
| 2018/0365585 | A1 | 12/2018 | Smith | |
| 2018/0373995 | A1 | 12/2018 | Tomaru et al. | |
| 2018/0375650 | A1 | 12/2018 | Legre | |
| 2019/0042964 | A1 | 2/2019 | Elsherbini et al. | |
| 2019/0042965 | A1 | 2/2019 | Clarke | |
| 2019/0042970 | A1* | 2/2019 | Zou | G06F 15/16 |
| 2019/0042971 | A1 | 2/2019 | Zou | |
| 2019/0042972 | A1 | 2/2019 | Zou | |
| 2019/0042973 | A1 | 2/2019 | Zou | |
| 2019/0049495 | A1 | 2/2019 | Ofek | |
| 2019/0251478 | A1 | 8/2019 | Bishop et al. | |
| 2019/0266512 | A1 | 8/2019 | Shen et al. | |
| 2019/0302832 | A1 | 10/2019 | Morgan et al. | |
| 2019/0317589 | A1 | 10/2019 | Mathur et al. | |
| 2019/0385088 | A1 | 12/2019 | Naaman et al. | |
| 2020/0293080 | A1 | 9/2020 | Poon et al. | |
| 2020/0364602 | A1 | 11/2020 | Niu et al. | |
| 2021/0004707 | A1 | 1/2021 | Gambetta et al. | |
| 2021/0091755 | A1 | 3/2021 | Cohen et al. | |
| 2021/0103847 | A1 | 4/2021 | Akzam | |
| 2021/0125096 | A1 | 4/2021 | Puri et al. | |
| 2021/0359670 | A1 | 11/2021 | Cohen et al. | |

FOREIGN PATENT DOCUMENTS

| | | | |
|---|---|---|---|
| CN | 104467843 | A | 3/2015 |
| CN | 105281886 | A | 1/2016 |
| CN | 105912070 | A | 8/2016 |
| CN | 107408223 | A | 11/2017 |
| CN | 108111306 | A | 6/2018 |
| CN | 108594214 | A | 9/2018 |
| CN | 108698815 | A | 10/2018 |
| CN | 109165744 | A | 1/2019 |
| CN | 110085094 | A | 8/2019 |
| CN | 108780129 | A | 11/2019 |
| CN | 110677210 | A | 1/2020 |
| CN | 111464154 | A | 7/2020 |
| CN | 111767055 | A | 10/2020 |
| CN | 112019193 | A | 12/2020 |
| CN | 112149832 | A | 12/2020 |
| EP | 0388052 | A2 | 9/1990 |
| JP | 2007049009 | A | 2/2007 |
| JP | 2011175078 | A | 9/2011 |
| JP | 2012188875 | A | 10/2012 |
| JP | 2018137739 | A | 8/2018 |
| WO | 2015178991 | A2 | 11/2015 |
| WO | 2015178992 | A2 | 11/2015 |
| WO | 2017078735 | A1 | 5/2017 |
| WO | 2017123940 | A | 7/2017 |
| WO | 2017139683 | A1 | 8/2017 |
| WO | 2018055607 | A1 | 3/2018 |
| WO | 2018062991 | A1 | 4/2018 |
| WO | 2019063117 | A1 | 4/2019 |
| WO | 2020033807 | A1 | 2/2020 |
| WO | 2020231795 | A1 | 11/2020 |
| WO | 2021123903 | A1 | 6/2021 |

OTHER PUBLICATIONS

Int'l Search Report and Written Opinion Appln No. PCT/IB2019/001410 mailed Jun. 10, 2020.

Int'l Search Report and Written Opinion Appln No. PCT/IB2019/001394 mailed Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009; 17(15):12929-43.

(56) References Cited

OTHER PUBLICATIONS

Int'l Search Report and Written Opinion Appln No. PCT/IB2020/000218 mailed Aug. 11, 2020.
Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).
Int'l Search Report and Written Opinion Appln No. PCT/IB2020/000376 mailed Sep. 17, 2020.
Breitfelder et al. eds., IEEE 100: The Authoritative Dictionary of IEEE Standards Terms 1247, definition 2 of "variable" (7th ed. 2000). (Year: 2000).
Int'l Search Report and Written Opinion Appln No. PCT/IB2020/000707 mailed Jan. 12, 2021.
National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4, pp. 30, 57.
IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 mailed Jan. 17, 2021.
Wolfowicz, et al. Pulse Techniques for Quantum Information Processing University of Chicago, University College London, eMagRes, 2016, vol. 5: 1515-1528. DOI 10.1002/9780470034590.emrstm1521.
Int'l Search Report and Written Opinion Appln No. PCT/IB2020/000555 mailed Dec. 27, 2020.
Int'l Search Report and Written Opinion Appln No. PCT/IB2020/000760 mailed Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: <https://arxiv.org/pdf/1710.04645.pdf> McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 mailed May 13, 2021.
Int'l Preliminary Report on Patentability Appln No. PCT/IB2019/001410 mailed Jun. 10, 2021.
Int'l Search Report and Written Opinion Appln No. PCT/IB2021/000067 mailed Jun. 21, 2021.
Int'l Preliminary Report on Patentability Appln No. PCT/IB2019/001394 mailed Jul. 29, 2021.
Int'l Preliminary Report on Patentability Appln No. PCT/IB2020/000218 mailed Sep. 16, 2021.
Int'l Preliminary Report on Patentability Appln No. PCT/IB2020/000376 mailed Nov. 12, 2021.
Int'l Search Report and Written Opinion Appln No. PCT/IB2021/056254 mailed Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Int'l Preliminary Report on Patentability Appln No. PCT/IB2020/000555 mailed Feb. 10, 2022.
Int'l Preliminary Report on Patentability Appln No. PCT/IB2020/000707 mailed Mar. 17, 2022.
Int'l Preliminary Report on Patentability Appln No. PCT/IB2020/000704 mailed Mar. 17, 2022.
Int'l Preliminary Report on Patentability Appln No. PCT/IB2020/000760 mailed Apr. 7, 2022.
Int'l Search Report and Written Opinion Appln No. PCT/IB2022/050190 mailed Apr. 11, 2022.
Int'l Search Report and Written Opinion Appln No. PCT/IB2022/000059 mailed Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 mailed Jun. 30, 2022.
Int'l Search Report and Written Opinion Appln No. PCT/IB2022/000024 mailed Jul. 18, 2022.
Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).
Int'l Search Report and Written Opinion Appln No. PCT/IB2022/000068 mailed Jul. 17, 2022.
D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).
Extended European Search Report Appln No. 19889443.8 dated Aug. 4, 2022.
Int'l Search Report and Written Opinion Appln No. PCT/IB2022/054903 mailed Sep. 8, 2022.
Int'l Preliminary Report on Patentability Appln No. PCT/IB2021/000067 mailed Sep. 22, 2022.
Int'l Search Report and Written Opinion Appln No. PCT/IB2022/053304 mailed Oct. 6, 2022.
Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.
Extended European Search Report Appln No. 19910800.2 dated Oct. 6, 2022.
Hornibrook J Met al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.
Fu X et al: "An Experimental Microarchitecture for a Superconducting Quantum Processor", MICRO-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.
Zopes J. et al: "High resolution quantum sensing with shaped control pulses", arxiv.org, Cornell University Library, 201 Olin Library Cornell University Ithaca, NY 14853, May 22, 2017 (May 22, 2017), XP081276850.
Cross et al. "Open Quantum Assembly Language", Jan. 10, 2017.
European Office Communication with extended Search Report Appln No. 20766036.6 dated Nov. 24, 2022.
Japanese Patent Office Action Appln No. 2021-529723 dated Oct. 26, 2022 with translation.
Lavoie et al., "A Formalization for Specifying and Implementing Correct Pull-Stream Modules," in arXiv preprint arXiv: 1801.06144 (2018). (Year: 2018).
Fu et al., "A Microarchitecture for a Superconducting Quantum Processor," in 38.3 I EEE Micro 40-47 (2018). (Year: 2018).
Extended European Search Report Appln No. 20845965.1 dated Jun. 29, 2023.
European Office Communication with extended Search Report Appln No. 20861242.4 dated Jul. 7, 2023.
European Office Communication with extended Search Report Appln No. 23153085.8 dated Jul. 3, 2023.
Yang Yet al: "FPGA-based electronic system for the control and readout of superconducting qubit systems", arxiv.org, Cornell University Library, 201 Yang Yet al: "FPGA-based electronic system for the control and readout of superconducting qubit systems",

(56) References Cited

OTHER PUBLICATIONS arxiv.org, Cornell University Library, 201 Olin Library Cornell University Ithaca, NY 14853, Oct. 15, 2021 (Oct. 15, 2021), XP091078848.
Gebauer Richard et al: "A modular RFSoC-based approach to interface superconducting quantum bits", 2021 International Conference on Field-Programmable Technology (ICFPT), IEEE, Dec. 6, 2021 (Dec. 6, 2021), pp. 1-9, XP034028257, DOI: 10.1109/ICFPT52863.2021.9609909 [retrieved on Nov. 8, 2021].
European Office Communication with extended Search Report Appln No. 20861100.4 dated Jul. 21, 2023.
Fu et al. "eQASM: An Executable Quantum 1-15 Instruction Set Architecture", 2019 IEEE International Symposium on High Performance Computer Architecture (HPCA), IEEE Feb. 16, 2019 (Feb. 16, 2019), pp. 224-237, XP033532496, DOI: 10.1109/HPCA.2019.00040 Retrieved from the Internet: URL: https://ieeexplore.ieee.org/abstract/document/8675197/authors#authors [retrieved on Mar. 26, 2019].
Yunong Shi et al: "Optimized Compilation of Aggregated Instructions for Realistic Quantum Computers", arxiv.org, Cornell University Library, 201 Olin Library Cornell University Ithaca, NY 14853, Feb. 4, 2019 (Feb. 4, 2019), XP081025321, DOI: 10.1145/3297858.3304018.
Chinese Patent Office Action Appln No. 2019800888907 with search report dated Jul. 28, 2023 with translation.
European Office Communication with extended Search Report Appln No. 20869503.1 dated Sep. 12, 2023.
Chinese Office Action Appln No. 2019800902340 with search report dated Aug. 30, 2023 with translation.
Int'l Preliminary Report on Patentability Appln No. PCT/IB2022/050190 mailed Oct. 19, 2023.
Int'l Preliminary Report on Patentability Appln No. PCT/IB2022/000068 mailed Nov. 23, 2023.
Int'l Preliminary Report on Patentability Appln No. PCT/IB2022/000059 mailed Nov. 23, 2023.
Int'l Preliminary Report on Patentability Appln No. PCT/IB2022/000024 mailed Nov. 9, 2023.
European Office Communication with extended Search Report Appln No. 20902662.4.6 dated Dec. 21, 2023.
Int'l Preliminary Report on Patentability Appln No. PCT/IB2022/054903 mailed Dec. 28, 2023.
Int'l Preliminary Report on Patentability Appln No. PCT/IB2022/053304 mailed Feb. 1, 2024.
Chinese Office Action Appln No. 2019800888907 dated Nov. 17, 2023.
Japanese Patent Office Action Appln No. 2023-042662 dated Apr. 22, 2024 with translation.
Extended European Search Report Appln No. 22795078.9 dated Feb. 7, 2025.

* cited by examiner

QUANTUM CONTROLLER WITH MULTIPLE PULSE MODES

PRIORITY CLAIM

The present application is a continuation of U.S. patent application Ser. No. 18/359,944 filed Jul. 27, 2023, which is a continuation of U.S. patent application Ser. No. 17/725,829 filed Apr. 21, 2022 (U.S. Pat. No. 11,736,096), which is a continuation of U.S. patent application Ser. No. 17/207,827 filed Mar. 22, 2021 (U.S. Pat. No. 11,342,905), which is a continuation of U.S. patent application Ser. No. 15/931,644 filed May 14, 2020 (U.S. Pat. No. 10,985,739), which is a continuation of U.S. patent application Ser. No. 16/659,599 filed Oct. 22, 2019 (U.S. Pat. No. 10,659,018), which is a continuation of U.S. patent application Ser. No. 16/247,115 filed Jan. 14, 2019 (U.S. Pat. No. 10,454,459). Each of the above-referenced applications is hereby incorporated herein by reference in its entirety.

BACKGROUND

Limitations and disadvantages of conventional approaches to quantum computer control systems will become apparent to one of skill in the art, through comparison of such approaches with some aspects of the present method and system set forth in the remainder of this disclosure with reference to the drawings.

BRIEF SUMMARY

Methods and systems are provided for a quantum controller with multiple pulse modes, substantially as illustrated by and/or described in connection with at least one of the figures, as set forth more completely in the claims.

DETAILED DESCRIPTION

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Figure 1A:
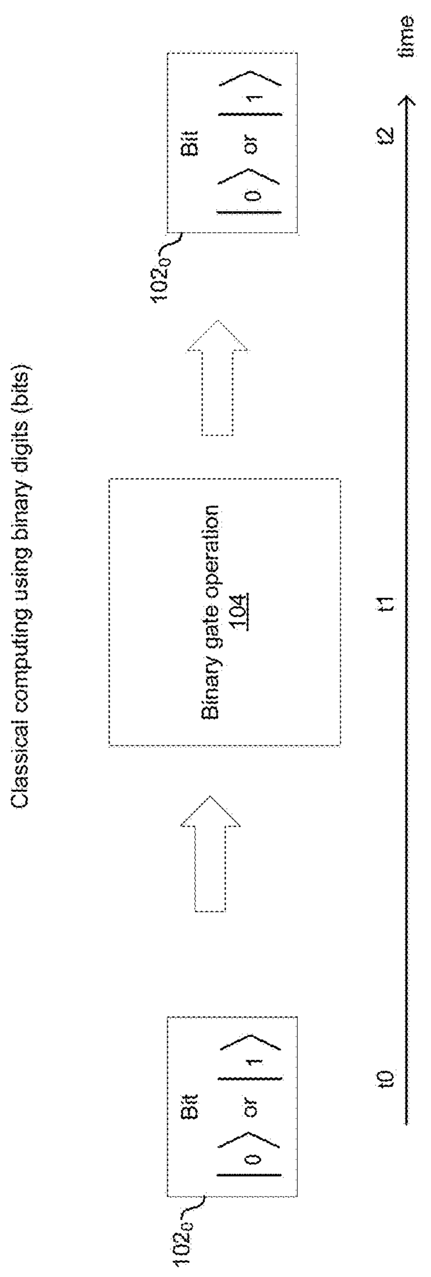
FIGS. 1A and 1B compare some aspects of classical (binary) computing and quantum computing.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1 Vdc or 0 Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle+\beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2\cdot|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively, and then the qubit state is represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Figure 1B:
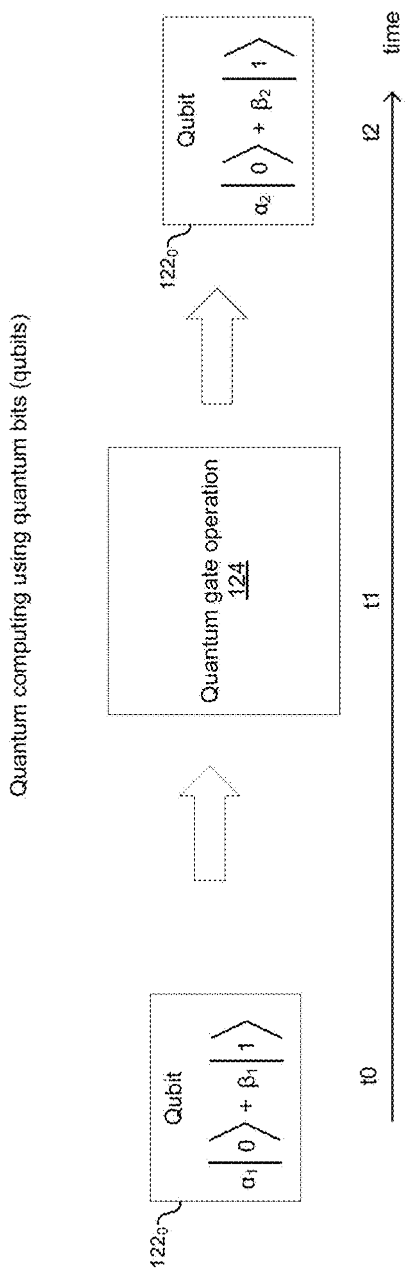

Shown in FIG. 1B is a simple example of a quantum computer configured t0 store a qubit 122 and apply a single quantum gate operation 124 to the qubit 122. At time t0 the qubit 122 is described by $\alpha_1|0\rangle+\beta_1|1\rangle$, at time t1 the logic operation 104 is applied to the qubit 122, and at time t2 the qubits 122 is described by $\alpha_2|0\rangle+\beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

Figure 2:
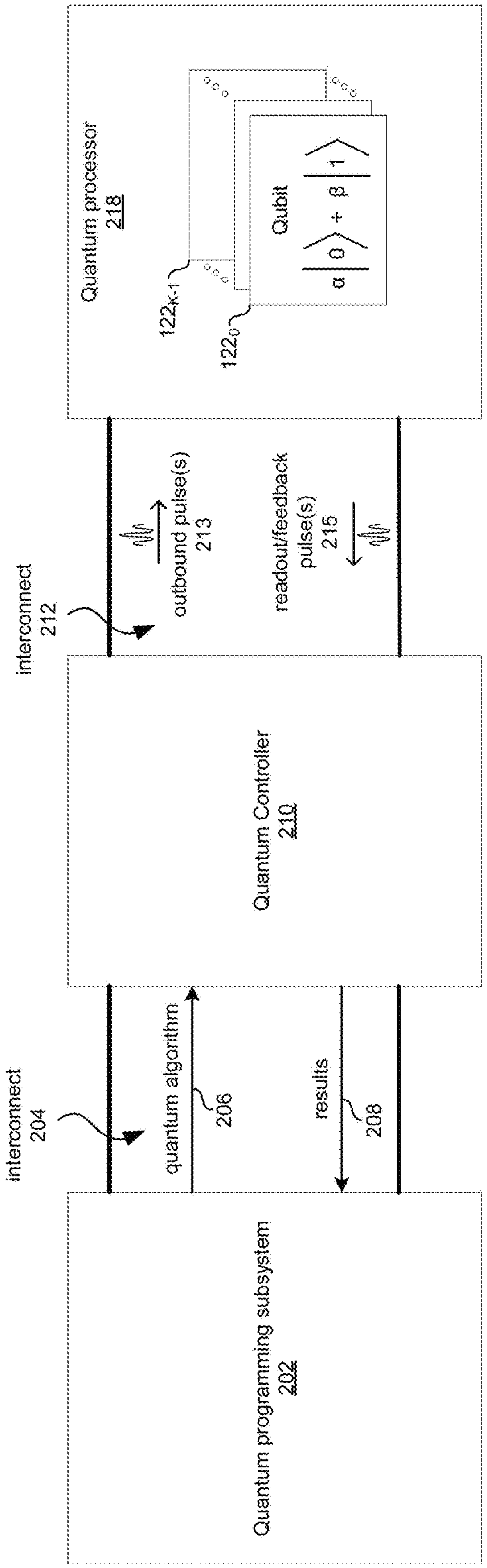
FIG. 2 shows an example quantum computing system.

FIG. 2 shows an example quantum computing system. The system comprises a quantum programming subsystem 202, a quantum controller 210, and a quantum processor 218.

The quantum programming subsystem 202 comprises circuitry operable to generate a quantum algorithm description 206 which the quantum controller 210 can execute to carry out the quantum algorithm on the quantum processor 218 (i.e., generate the necessary outbound quantum pulse(s) 213) with little or no human intervention during runtime of the algorithm. In an example implementation, the quantum programming system 202 is a personal computer having installed on it a quantum controller software development kit (SDK) that enables a user to generate the quantum algorithm description 206 using a programming language. In an example implementation, the programming language may be a low-level language which has little or no abstraction from the instruction set used by the specific hardware of the quantum controller 210. Such instructions may be converted to machine code of the quantum controller 210 without need of a compiler or interpreter. In an example implementation, the programming language may be a high-level language which is much more abstracted from the particular hardware of the quantum controller 210. Such instructions may be compiled into machine code before they can be run on the quantum controller 210. In an example implementation the description 206 may be a machine code description of the quantum algorithm. In an example implementation, the description 206 may be a high-level description which the quantum controller 210 may itself compile into machine code. In an example implementation, the description 206 may be a high-level description which the quantum controller 210 may interpret into machine code during runtime. In an example implementation, an operating system or other software layer may run on the quantum controller 210 and the quantum algorithm description 206 may be software instructions that make use of an application programming interface (API) of the software running on the quantum controller 210.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol.

The quantum controller 210 comprises circuitry operable to load the quantum algorithm description 206 and then perform the quantum algorithm as per the quantum algorithm description 206. In an example implementation, quantum algorithm description 206 is machine code (i.e., series of binary vectors that represent instructions that the quantum controller's hardware can interpret and execute directly) which is loaded into the quantum controller 210. Then, execution of the machine code by the quantum controller 210 causes the quantum controller 210 to generate the necessary outbound quantum control pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

Upon completion of a quantum algorithm and/or during a runtime of a quantum algorithm by the quantum controller 210, the quantum controller 210 may output data/results 298 to the quantum programming subsystem 202. In an example implementation these results may be used to generate a new quantum algorithm description 206 for a subsequent run of the quantum algorithm and/or update the quantum algorithm description during runtime.

The quantum controller 210 is coupled to the quantum processor 218 via interconnect 212 which may comprise, for example, one or more conductors and/or optical fibers.

Figure 3A:
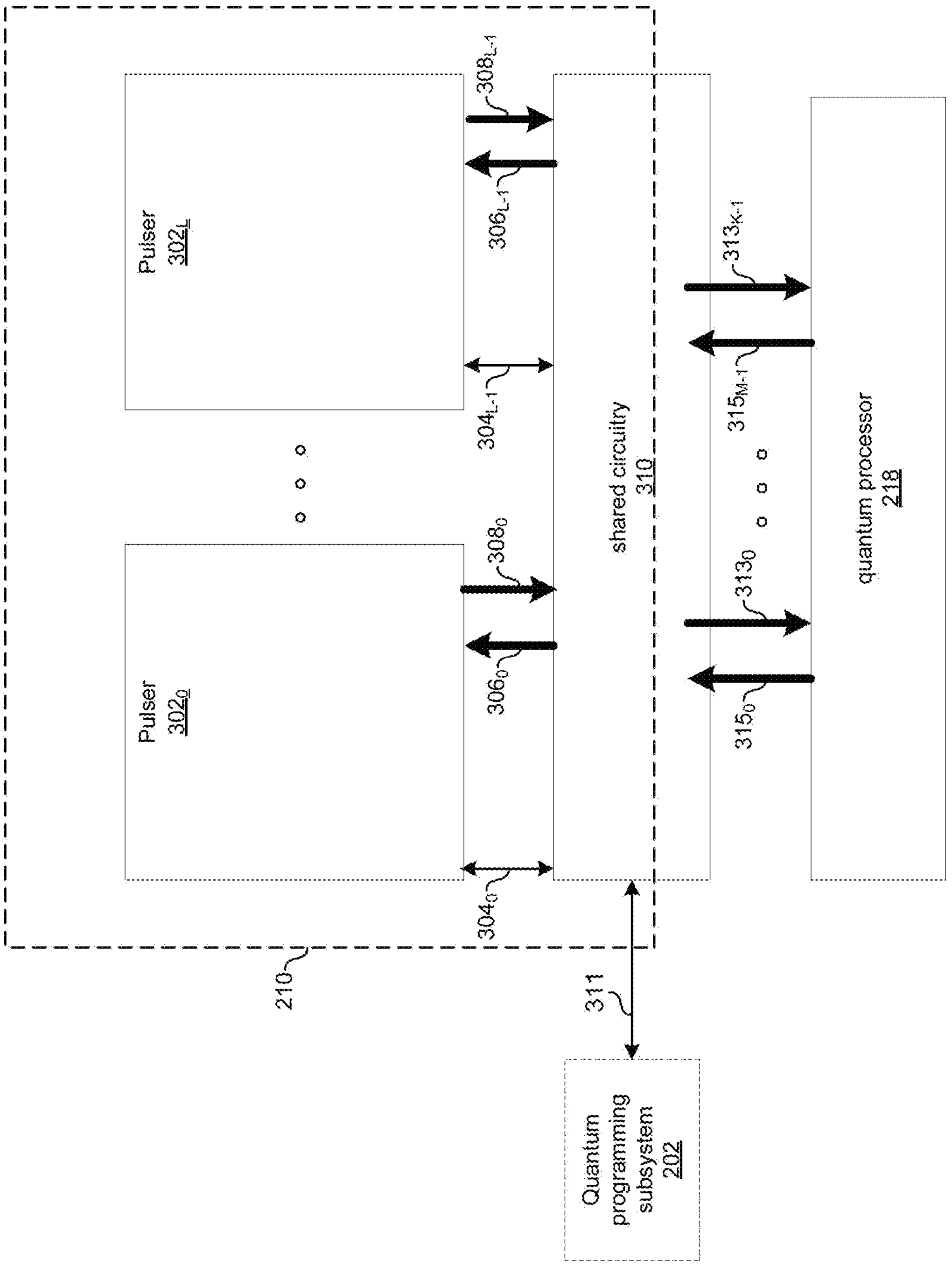
FIG. 3A shows an example quantum controller architecture in accordance with various example implementations of this disclosure.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum control pulses 213 and 215 between interconnect 212 and the quantum element(s) 122 (e.g., readout resonator(s)). In an example implementation in which the quantum processor comprises readout resonators (or other readout circuitry) K may be equal the total number of qubits plus the number of readout circuits. That is, if each of Q (an integer) qubits of the quantum processor 218 is associated with a dedicated readout circuit, then K may be equal to 2Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like FIG. 3A shows an example quantum controller architecture in accordance with various example implementations of this disclosure. The quantum controller 210 comprises L (an integer≥1) pulser circuits $\mathbf{302}_0$-$\mathbf{302}_{L-1}$ and shared circuitry 310.

In the example implementation shown, each pulser circuit $\mathbf{302}_l$ (l an integer between 0 and L−1) comprises circuitry for exchanging information over signal paths $\mathbf{304}_l$, $\mathbf{306}_l$, and $\mathbf{308}_l$, where the signal path $\mathbf{308}_l$ carries outbound pulses (e.g., 213 of FIG. 2) generated by the pulser circuit $\mathbf{302}_l$ (which may be, for example, control pulses sent to the quantum processor 128 to manipulate one or more properties of one or more quantum elements—e.g., manipulate a state of one or more qubits, manipulate a frequency of a qubit using flux biasing, etc., and/or readout a state of one or more quantum elements), the signal path $\mathbf{306}_l$ carries inbound quantum element readout pulses (e.g., 215 of FIG. 2) to be processed by the pulser circuit $\mathbf{302}_l$, and signal path $\mathbf{304}_l$ carries control information. Each signal path may comprise one or more conductors, optical channels, and/or wireless channels.

Each pulser circuit $\mathbf{302}_l$ comprises circuitry operable to generate outbound pulses on signal path $\mathbf{308}_l$ according to quantum control operations to be performed on the quantum processor 218. This involves very precisely controlling characteristics such as phase, frequency, amplitude, and timing of the outbound pulses. The characteristics of an outbound pulse generated at any particular time may be determined, at least in part, on inbound pulses received from the quantum processor 218 (via shared circuitry 310 and signal path $\mathbf{306}_l$) at a prior time. In an example implementation, the time required to close the feedback loop (i.e., time from receiving a first pulse on one or more of paths $\mathbf{315}_1$-$\mathbf{315}_L$ (e.g., at an analog to digital converter of the path) to sending a second pulse on one or more of paths $\mathbf{313}_0$-$\mathbf{313}_{L-1}$ (e.g., at an output of a digital-to-analog converter of the path), where the second pulse is based on the first pulse) is significantly less than the coherence time of the qubits of the quantum processor 218. For example, the time to close the feedback loop may be on the order of 100 nanoseconds. It should be noted that each signal path in FIG. 3A may in practice be a set of signal paths for supporting generation of multi-pulse sets (e.g., two signal paths for two-pulse pairs, three signal paths for three-pulse sets, and so on).

In the example implementation shown, the shared circuitry 310 comprises circuitry for exchanging information with the pulser circuits $\mathbf{302}_0$-$\mathbf{302}_{L-1}$ over signal paths $\mathbf{304}_0$-$\mathbf{304}_{L-1}$, $\mathbf{306}_0$-$\mathbf{306}_{L-1}$, and $\mathbf{308}_0$-$\mathbf{308}_{L-1}$, where each signal path $\mathbf{308}_l$ carries outbound pulses generated by the pulser circuit $\mathbf{302}_l$, each signal path $\mathbf{306}_l$ carries inbound pulses to be processed by pulser circuit $\mathbf{302}_l$, and each signal path $\mathbf{304}_l$ carries control information such as flag/status signals, data read from memory, data to be stored in memory, data streamed to/from the quantum programming subsystem 202, and data to be exchanged between two or more pulsers $\mathbf{302}_0$-$\mathbf{302}_L$. Similarly, in the example shown the shared circuitry 310 comprises circuitry for exchanging information with the quantum processor 218 over signal paths $\mathbf{315}_0$-$\mathbf{315}_{M-1}$ and $\mathbf{313}_1$-$\mathbf{313}_{K-1}$, where each signal path $\mathbf{315}_m$ (m an integer between 0 and M−1) carries inbound pulses from the quantum processor 218, and each signal path $\mathbf{313}_k$ (k an integer between 0 and K−1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller (e.g., on the same field programmable gate array or application specific integrated circuitry or printed circuit board); external to the quantum controller (e.g., on a separate FPGA, ASIC, or PCB connected to the quantum controller via one or more cables, backplanes, in other devices connected to the quantum processor 218, etc.); or partially integrated with the quantum controller and partially external to the quantum controller.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $\mathbf{302}_l$ may be shared among multiple of the K quantum elements circuits. That is, any pulser $\mathbf{302}_l$ may generate pulses for different quantum elements at different times. This ability of a pulser $\mathbf{302}_l$ to generate pulses for different quantum elements at different times can reduce the required number of pulsers $\mathbf{302}_0$-$\mathbf{302}_{L-1}$ (i.e., reduce L) required to support a given number of quantum elements (thus saving significant resources, cost, size, overhead when scaling to larger numbers of qubits, etc.).

The ability of a pulser $\mathbf{302}_l$ to generate pulses for different quantum elements at different times also enables reduced latency. As just one example, assume a quantum algorithm which needs to send a pulse to quantum element $\mathbf{122}_0$ at time T1, but whether the pulse is to be of a first type or second type (e.g., either an X pulse or a Hadamard pulse) cannot be determined until after processing an inbound readout pulse at time T1-DT (i.e., DT time intervals before the pulse is to be output). If there were a fixed assignment of pulsers $\mathbf{302}_0$-$\mathbf{302}_{L-1}$ to quantum elements of the quantum processor 218 (i.e., if $\mathbf{302}_0$ could only send pulses to quantum element $\mathbf{122}_0$, and $\mathbf{302}_1$ could only send pulses to quantum element $\mathbf{122}_1$, and so on), then pulser $\mathbf{302}_0$ might not be able to start generating the pulse until it determined what the type was to be. In the depicted example implementation, on the other hand, pulser $\mathbf{302}_0$ can start generating the first type pulse and pulser $\mathbf{302}_1$ can start generating the second type pulse and then either of the two pulses can be released as soon as the necessary type is determined. Thus, if the time to generate the pulse is $T_{lat}$, in this example the example quantum controller 210 may reduce latency of outputting the pulse by $T_{lat}$.

The shared circuitry 310 is thus operable to receive pulses via any one or more of the signals paths $\mathbf{308}_0$-$\mathbf{308}_{L-1}$ and/or $\mathbf{315}_0$-$\mathbf{315}_{M-1}$, process the received pulses as necessary for carrying out a quantum algorithm, and then output the resulting processed pulses via any one or more of the signal paths $\mathbf{306}_0$-$\mathbf{306}_{L-1}$ and/or $\mathbf{313}_0$-$\mathbf{313}_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the quantum algorithm description; and/or dynamically determined (at least in part) during runtime of the quantum algorithm based on classical programs/computations performed during runtime, which may involve processing of inbound pulses. As an example of predetermined pulse generation and routing, a quantum algorithm description may simply specify that a particular pulse with predetermined characteristics is to be sent to signal path $\mathbf{313}_1$ at a predetermined time. As an example of dynamic pulse determination and routing, a quantum algorithm description may specify that an inbound readout pulse at time T-DT should be analyzed and its characteristics (e.g., phase, frequency, and/or amplitude) used to determine, for example, whether at time T pulser $\mathbf{302}_l$ should output a pulse to a first quantum element or to a second quantum element or to determine, for example, whether at time T pulser $\mathbf{302}_l$ should output a first pulse to a first quantum element or a second pulse to the first quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $\mathbf{302}_0$-$\mathbf{302}_{L-1}$. For example, a function may be desirable to implement in the shared circuitry 310 where the same function is needed by a number of pulser circuits from $\mathbf{302}_0$-$\mathbf{302}_{L-1}$ and thus may be shared among these pulser circuits instead of redundantly being implemented inside each pulser circuit. As another example, a function may be desirable to implement in the shared circuitry 310 where the function is not needed by all pulser circuits $\mathbf{302}_0$-$\mathbf{302}_{L-1}$ at the same time and/or on the same frequency and thus fewer than L circuits for implementing the function may be shared among the L pulser circuits $\mathbf{302}_0$-$\mathbf{302}_{L-1}$ through time and/or frequency division multiplexing. As another example, a function may be desirable to implement in the shared circuitry 310 where the function involves making decisions based on inputs, outputs, and/or state of multiple of the L pulser circuits $\mathbf{302}_0$-$\mathbf{302}_{L-1}$, or other circuits. Utilizing a centralized coordinator/decision maker in the shared circuitry 310 may have the benefit(s) of: (1) reducing pinout and complexity of the pulser circuits $\mathbf{302}_0$-$\mathbf{302}_{L-1}$; and/or (2) reducing decision-making latency. Nevertheless, in some implementations, decisions affecting multiple pulser circuits $\mathbf{302}_0$-$\mathbf{302}_{L-1}$ may be made by one or more of the pulser circuits $\mathbf{302}_0$-$\mathbf{302}_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
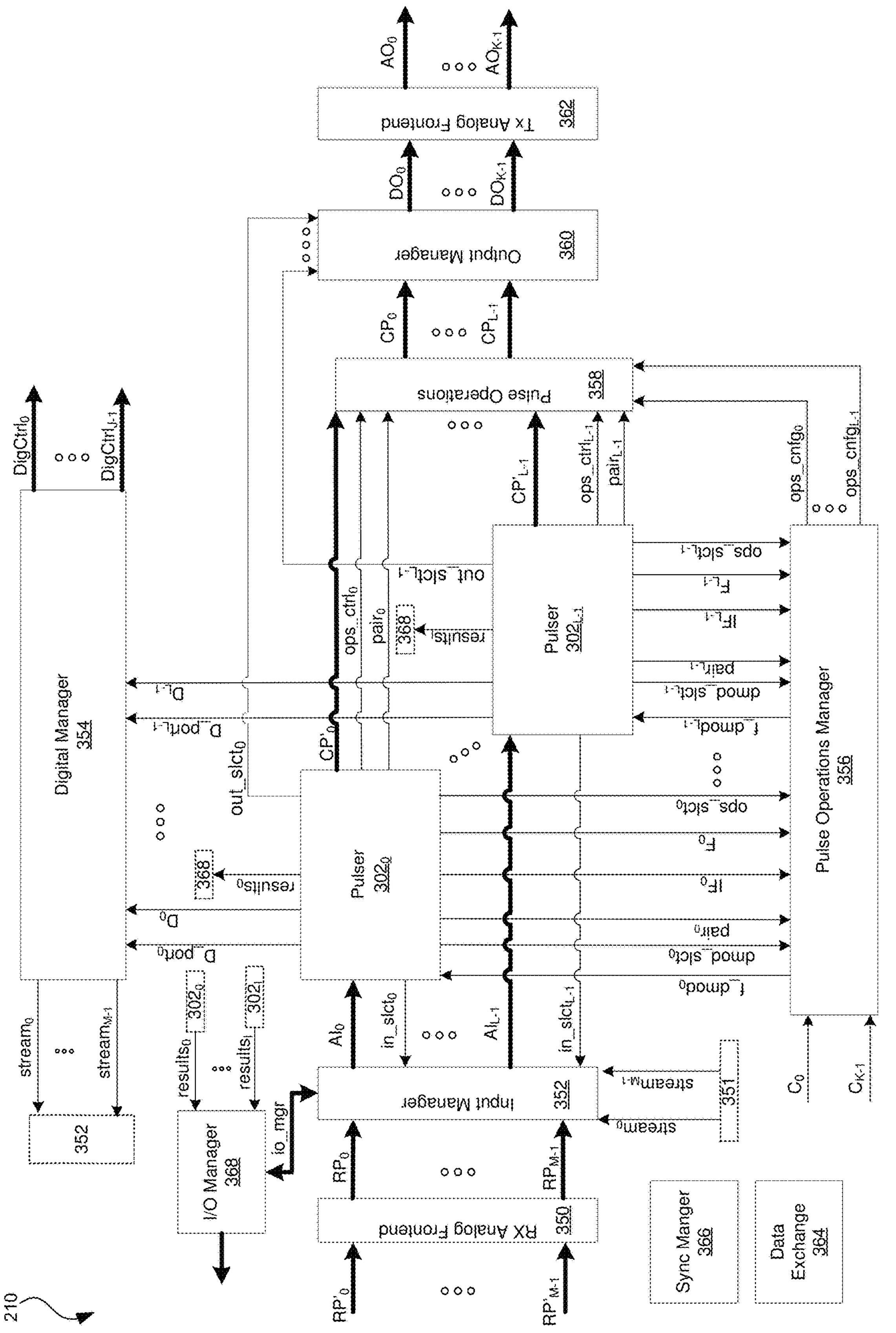
FIG. 3B shows an example implementation of the quantum controller circuitry of FIG. 3A.

FIG. 3B shows an example implementation of the quantum controller of FIG. 2. The example quantum controller shown comprises pulsers $\mathbf{302}_1$-$\mathbf{302}_{L-1}$, receive analog frontend 350, input manager 352, digital manager 354, pulse operations manager 356, pulse operations 358, output manager 360, transmit analog frontend 362, data exchange 364, synchronization manager 366, and input/output ("I/O") manager 368. Circuitry depicted in FIG. 3B other than pulser circuits $\mathbf{302}_0$-$\mathbf{302}_{L-1}$ corresponds to an example implementation of the shared circuitry 310 of FIG. 3A.

The receive analog frontend 350 comprises circuitry operable to concurrently process up to M (an integer≥1) analog inbound signals ($RP'_0$-$RP'_{M-1}$) received via signal paths $\mathbf{315}_0$-$\mathbf{315}_{M-1}$ to generate up to M concurrent inbound signals ($RP_0$-$RP_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals ($RP_0$-$RP_{M-1}$) to any one or more of pulsers $\mathbf{302}_0$-$\mathbf{302}_{L-1}$ (as signal(s) $AI_0$-$AI_{L-1}$) and/or to other circuits (e.g. as signal io_mgr to I/O manager 368). In an example implementation, the input manager 352 comprises one or more switch networks, multiplexers, and/or the like for dynamically reconfiguring which signals $RP_0$-$RP_{M-1}$ are routed to which pulsers $\mathbf{302}_0$-$\mathbf{302}_{L-1}$. This may enable time division multiplexing multiple of the signals $RP_0$-$RP_{M-1}$ onto a single signal $AI_l$ and/or time division demultiplexing components (e.g., time slices) of a signal $RP_m$ onto multiple of the signals $AI_0$-$AI_{L-1}$. In an example implementation, the input manager 352 comprises one or more mixers and/or filters for frequency division multiplexing multiple of the signals $RP_0$-$RP_{M-1}$ onto a single signal $AI_l$ and/or frequency division demultiplexing components (e.g., frequency bands) of a signal $RP_m$ onto multiple of the signals $AI_0$-$AI_{L-1}$. The signal routing and multiplexing/demultiplexing functions performed by the input manager 352 enables: a particular pulser $\mathbf{302}_l$ to process different inbound pulses from different quantum elements at different times; a particular pulser $\mathbf{302}_l$ to process different inbound pulses from different quantum elements at the same time; and multiple of the pulsers $\mathbf{302}_0$-$\mathbf{302}_{L-1}$ to processes the same inbound pulse at the same time. In the example implementation shown, routing of the signals $RP_0$-$RP_{M-1}$ among the inputs of the pulsers $\mathbf{302}_0$-$\mathbf{302}_{L-1}$ is controlled by digital control signals $in\_slct_0$-$in\_slct_{L-1}$ from the pulsers $\mathbf{302}_0$-$\mathbf{302}_{L-1}$. In another implementation, the input manager may be operable to autonomously determine the appropriate routing (e.g., where the quantum algorithm description includes instructions to be loaded into memory of, and executed by, the input manager 352). In the example implementation, the input manager 352 is operable to rout input signals $RP_0$-$RP_{M-1}$ to the I/O manager 368 (as signal(s) io_mgr), to be sent to the quantum programing subsystem 202. This routing may, for example, be controlled by signals from the digital manager 354. In an example implementation, for each input signal $RP_m$ there is a digital signal, $stream_m$, from the digital manager 354 to the input manager 352 that controls whether $RP_m$ will be sent from the input manager 352 to the I/O manager 368 and from there to the quantum programing subsystem 202.

In an example implementation, the input manager 352 is operable to process one or more signals $RP_0$-$RP_{M-1}$ as either independent signals and/or one or more of signals $RP_0$-$RP_{M-1}$ as multi-signal sets (referred to as "pairs" in the case of two). The determination of whether to processes any particular signal $RP_m$ independently or as part of a multi-signal set may be determined dynamically during runtime and/or may be predetermined in quantum algorithm description. In this regard, the input manager 352 may be operable to perform functions similar to functions described below performed by pulse operations manager 356 and/or pulse operations circuitry 358 (e.g., generation and selection of modification settings, application of the modification settings, and multiplication by a mask matrix). For example, $RP_2$ and $RP_4$ (arbitrarily selected from among $RP_0$-$RP_{M-1}$) may in some instances be processed as independent signals and in some instances be processed as a two-signal pair (e.g., in phase-quadrature).

Each of the pulsers $\mathbf{302}_0$-$\mathbf{302}_{L-1}$ is as described above with reference to FIG. 3A. In the example implementation shown, each pulsers $\mathbf{302}_l$ is operable to generate raw outbound pulses $CP'_l$ ("raw" is used simply to denote that the pulse has not yet been processed by pulse operations circuitry 358) and digital control signals $in\_slct_l$, $D\_port_l$, $D_l$, $out\_slct_l$, $ops\_ctrl_l$, $ops\_slct_l$, $IF_l$, $F_l$, and $dmod\_sclt_l$ for carrying out quantum algorithms on the quantum processor 218, and $results_l$ for carrying intermediate and/or final results generated by the pulser $\mathbf{302}_l$ to the quantum programming subsystem 202. One or more of the pulsers $\mathbf{302}_0$-$\mathbf{302}_{L-1}$ may receive and/or generate additional signals which are not shown in FIG. 3A for clarity of illustration.

The raw outbound pulses $CP'_0$-$CP'_{L-1}$ are conveyed via signal paths 308$_0$-308$_{L-1}$ and the digital control signals are conveyed via signal paths 304$_0$-304$_{L-1}$. Each of the pulsers 302$_l$ is operable to receive inbound pulse signal $AI_l$ and signal f_dmod$_l$. Pulser 302$_l$ may process the inbound signal $AI_l$ to determine the state of certain quantum element(s) in the quantum processor 218 and use this state information for making decisions such as, for example, which raw outbound pulse $CP'_l$ to generate next, when to generate it and what control signals to generate to affect the characteristics of that raw outbound pulse appropriately. Pulser 302$_l$ may use the signal f_dmod$_l$ for determining how to process inbound pulse signal $AI_l$. As an example, when pulser 302$_1$ needs to process an inbound signal $AI_1$ from quantum element 122$_3$, it can send a dmod_sclt$_1$ signal that directs pulse operations manager 356 to send, on f_dmod$_1$, settings to be used for demodulation of an inbound signal $AI_1$ from quantum element 122$_3$ (e.g., the pulse operations manager 356 may send the value $\cos(\omega_3 * \text{time\_stamp} + \phi_3)$, where $\omega_3$ is the frequency of quantum element 122$_3$, time_stamp is amount of time passed since the reference point, for instance the time at which quantum algorithm started running, and $\phi_3$ is the phase of the total frame rotation of quantum element 122$_3$, i.e. the accumulated phase of all frame rotations since the reference point).

The pulse operations circuitry 358 is operable to process the raw outbound pulses $CP'_0$-$CP'_{L-1}$ to generate corresponding output outbound pulses $CP_0$-$CP_{L-1}$. This may comprise, for example, manipulating the amplitude, phase, and/or frequency of the raw pulse $CP'_l$. The pulse operations circuitry 358 receives raw outbound pulses $CP'_0$-$CP'_{L-1}$ from pulsers 302$_0$-302$_{L-1}$, control signals ops_cnfg$_0$-ops_cnfg$_{L-1}$ from pulse operations manager 356, and ops_ctrl$_0$-ops_ctrl$_{L-1}$ from pulsers 302$_0$-302$_{L-1}$.

The control signal ops_cnfg$_l$ configures, at least in part, the pulse operations circuitry 358 such that each raw outbound pulse $CP'_l$ that passes through the pulse operations circuitry 358 has performed on it one or more operation(s) tailored for that particular pulse. To illustrate, denoting a raw outbound pulse from pulser 302$_3$ at time T1 as $CP'_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse $CP'_{3,T1}$. Similarly, ops_cnfg$_{4,T1}$ provides the information as to what specific operations are to be performed on pulse $CP'_{4,T1}$, and ops_cnfg$_{3,T2}$ provides the information as to what specific operations are to be performed on pulse $CP'_{4,T1}$.

The control signal ops_ctrl$_l$ provides another way for the pulser 302$_l$ to configure how any particular pulse is processed in the pulse operations circuitry 358. This may enable the pulser 302$_l$ to, for example, provide information to the pulse operation circuitry 358 that does not need to pass through the pulse operation manager 356. For example, the pulser 302$_l$ may send matrix values calculated in real-time by the pulser 302$_l$ to be used by the pulse operation circuitry 358 to modify pulse $CP'_l$. These matrix values arrive to the pulse operation circuitry 358 directly from the pulser 302$_l$ and do not need to be sent to the pulse operation manager first. Another example maybe that the pulser 302$_l$ provides information to the pulse operation circuitry 358 to affect the operations themselves (e.g. the signal ops_ctrl$_l$ can choose among several different mathematical operations that can be performed on the pulse).

The pulse operations manager 356 comprises circuitry operable to configure the pulse operations circuitry 358 such that the pulse operations applied to each raw outbound pulse $CP'_l$ are tailored to that particular raw outbound pulse. To illustrate, denoting a first raw outbound pulse to be output during a first time interval T1 as $CP'_{l,T1}$, and a second raw outbound pulse to be output during a second time interval T2 as $CP'_{l,T2}$, then pulse operations circuitry 358 is operable to perform a first one or more operations on $CP'_{l,T1}$ and a second one or more operations on $CP'_{1,T2}$. The first one or more operations may be determined, at least in part, based on to which quantum element the pulse $CP_{1,T1}$ is to be sent, and the second one or more operations may be determined, at least in part, based on to which quantum element the pulse $CP_{1,T2}$ is to be sent. The determination of the first one or more operations and second one or more operations may be determined dynamically during runtime. The pulse operations circuitry 358 is operable to process each raw outbound pulse $CP'_l$ as either an independent pulse (the pulse operations circuitry 358 does not multiply the vector representation of the pulses by a matrix having non-zero, off-diagonal elements) or as one component of a multi-pulse set of pulses (the pulse operations circuitry 358 multiplies the vector representation of the pulse and one or more other raw outbound pulses by a matrix having non-zero, off-diagonal elements). In the example implementation shown, whether a particular pulse $CP'_l$ at time T1 (i.e., $CP'_{l,T1}$) is processed as an independent pulse or part of a multi-pulse set (e.g., a two-pulse pair) may be determined during runtime by the control signal pair$_l$ for time T1 (i.e., pair$_{l,T1}$), as further described below with reference to FIGS. 7A-9. Although two-pulse sets are used for illustration, in practice a set may comprise any number of pulses. For example, four-pulse set may be used and mixing of the four-pulses may be performed to compensate for crosstalk introduced by the signal paths onto which the four components are output.

The transmit analog frontend 362 comprises circuitry operable to concurrently process up to K digital signals $DO_k$ to generate up to K concurrent analog signals $AO_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths 313$_0$-313$_{K-1}$ (FIG. 3A) represents a respective portion of Tx analog frontend circuit 362 as well as a respective portion of interconnect 212 (FIG. 2) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals $DO_0$-$DO_{K-1}$ as K independent outbound pulses, as K/2 two-pulse pairs, or process some of signals $DO_0$-$DO_{K-1}$ as independent outbound pulses and some signals $DO_0$-$DO_{K-1}$ as two-pulse pairs (at different times and/or concurrently.

The output manager 360 comprises circuitry operable to route any one or more of signals $CP_0$-$CP_{L-1}$ to any one or more of signal paths 313$_0$-313$_{K-1}$. As just one possible example, signal path 313$_0$ may comprise a first path through the analog frontend 362 (e.g., a first mixer and DAC) that outputs $AO_0$ and traces/wires of interconnect 212 that carry signal $AO_0$; signal path $313_1$ may comprise a second path through the analog frontend 362 (e.g., a second mixer and DAC) that outputs $AO_1$ and traces/wires of interconnect 212 that carry signal $AO_1$, and so on. In an example implementation, the output manager 360 comprises one or more switch networks, multiplexers, and/or the like for dynamically reconfiguring which one or more signals $CP_0$-$CP_{L-1}$ are routed to which signal paths $313_0$-$313_{K-1}$. This may enable time division multiplexing multiple of the signals $CP_0$-$CP_{L-1}$ onto a single signal path $313_k$ and/or time division demultiplexing components (e.g., time slices) of a signal $CP_m$ onto multiple of the signal paths $313_0$-$313_{K-1}$. In an example implementation, the output manager 360 comprises one or more mixers and/or filters for frequency division multiplexing multiple of the signals $CP_0$-$CP_{M-1}$ onto a single signal path $313_k$ and/or frequency division demultiplexing components (e.g., frequency bands) of a signal $CP_m$ onto multiple of the signal paths $313_0$-$313_{K-1}$. The signal routing and multiplexing/demultiplexing functions performed by the output manager 360 enables: routing outbound pulses from a particular pulser 302, to different ones of the signal paths $313_0$-$313_{K-1}$ at different times; routing outbound pulses from a particular pulser $302_l$ to multiple of the signal paths $313_0$-$313_{K-1}$ at the same time; and multiple of the pulsers $302_0$-$302_{L-1}$ generating pulses for the same signal path $313_k$ at the same time. In the example implementation shown, routing of the signals $CP_0$-$CP_{L-1}$ among the signal paths $313_0$-$313_{K-1}$ is controlled by digital control signals $out\_slct_0$-$out\_slct_{L-1}$ from the pulsers $302_0$-$302_{L-1}$. In another implementation, the output manager 360 may be operable to autonomously determine the appropriate routing (e.g., where the quantum algorithm description includes instructions to be loaded into memory of, and executed by, the output manager 360). In an example implementation, at any given time, the output manager 360 is operable to concurrently route K of the digital signals $CP_0$-$CP_{L-1}$ as K independent outbound pulses, concurrently route K/2 of the digital signals $CP_0$-$CP_{L-1}$ as two-pulse pairs, or route some of signals $CP_0$-$CP_{L-1}$ as independent outbound pulses and some others of the signals $CP_0$-$CP_{L-1}$ as multi-pulse sets (at different times and/or concurrently).

The digital manager 354 comprises circuitry operable to process and/or route digital control signals ($DigCtrl_0$-$DigCtrl_{J-1}$) to various circuits of the quantum controller 210 and/or external circuits coupled to the quantum controller 210. In the example implementation shown, the digital manager receives, from each pulser $302_l$, (e.g., via one or more of signal paths $304_0$-$304_{N-1}$) a digital signal $D_l$ that is to be processed and routed by the digital manager 354, and a control signal $D\_port_l$ that indicates to which output port(s) of the digital manager 354 the signal $D_l$ should be routed. The digital control signals may be routed to, for example, any one or more of circuits shown in FIG. 3B, switches/gates which connect and disconnect the outputs $AO_0$-$AO_{K-1}$ from the quantum processor 218, external circuits coupled to the quantum controller 210 such as microwave mixers and amplifiers, and/or any other circuitry which can benefit from on real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_l$ to generate digital signals to different destinations and allows different ones of pulsers $302_0$-$302_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers $302_0$-$302_{L-1}$ generate, receive, and process pulses to and from different quantum elements at different times. For example, while carrying out a quantum algorithm, a first pulser circuit $302_1$ and a second pulser circuit $302_2$ may sometimes need to transmit pulses at precisely the same time and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3B. For example, while carrying out a quantum algorithm, first pulser circuit $302_1$ and a second pulser circuit $302_2$ may sometimes need to exchange information. As just one example, pulser $302_1$ may need to share, with pulser $302_2$, the characteristics of an inbound signal $AI_1$ that it just processed so that pulser $302_2$ can generate a raw outbound pulse $CP'_2$ based on the characteristics of $AI_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202.

Figure 4:
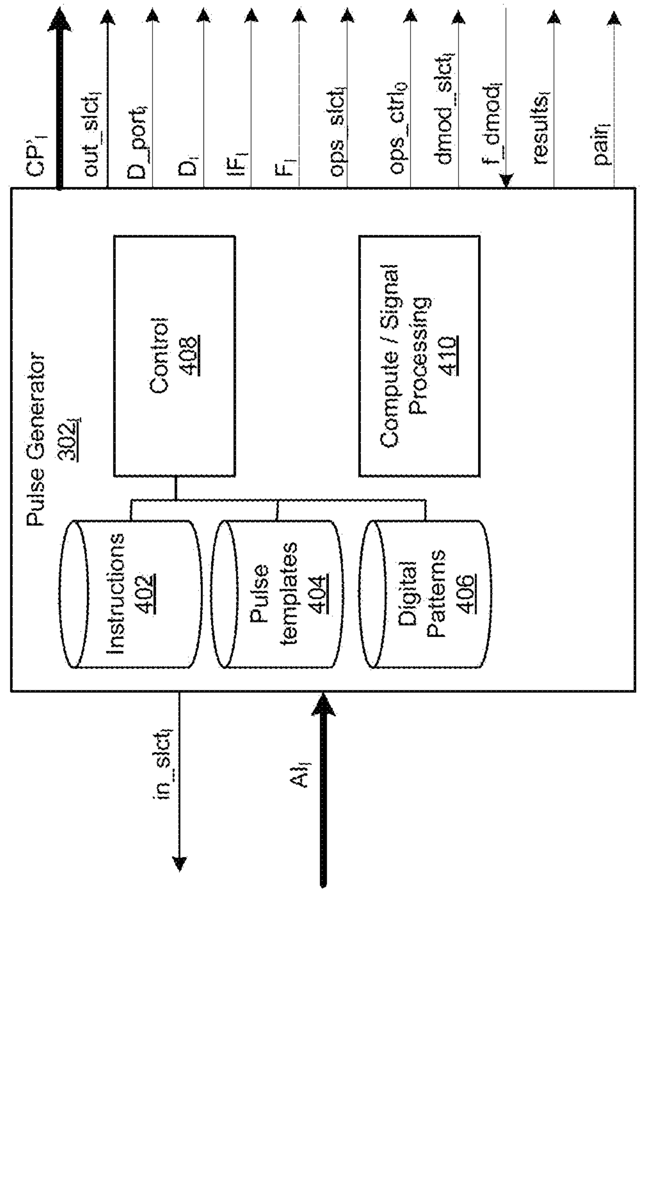
FIG. 4 shows an example implementation of the pulser of FIG. 3B.

FIG. 4 shows an example implementation of the raw pulser of FIG. 3B. The example pulser $302_l$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_l$ for carrying out its role in a quantum algorithm. Because different pulsers $302_0$-$302_{L-1}$ have different roles to play in any particular quantum algorithm (e.g., generating different pulses at different times), the instructions memory 402 for each pulser $302_l$ may be specific to that pulser. For example, the quantum algorithm description 206 from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $AI_l$, generate raw outbound pulses $CP'_l$, and generate digital control signals $in\_slct_l$, $out\_slct_l$, $D\_port_l$, $D_l$, $IF_l$, $F_l$, $ops\_slct_l$, $ops\_ctrl_l$, $results_l$, $dmod\_slct_l$ and $pair_l$. In the example implementation shown, the processing of the inbound signal $AI_l$ is performed by the CSP circuitry 410 and based (at least in part) on the signal $f\_dmod_l$.

The compute and/or signal processing circuitry (CSP) 410 is operable to perform computational and/or signal processing functions, which may comprise, for example Boolean-algebra based logic and arithmetic functions and demodulation (e.g., of inbound signals $AI_l$).

In operation of an example implementation, generation of a raw outbound pulse $CP'_l$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, $pair_l$, $ops\_slct_l$, and $dmod\_slct_l$ to be sent to the pulse operation manager 356 (as predetermined in the quantum algorithm description and/or determined dynamically based on results of computations and/or signal processing performed by the CSP 410); (5) determining the value of $ops\_ctrl_l$ to be sent to the pulse operation circuitry 358; (6) determining the value of $in\_slct_l$ to be sent to the input manager 352; (7) determining a digital pattern to retrieve from memory 406 (as predetermined in the quantum algorithm description and/or determined dynamically based on results of computations and/or signal processing performed by the CSP 410); (8) outputting the digital pattern as $D_l$ to the digital manager along with control signal $D\_port_l$ (as predetermined in the quantum algorithm description and/or determined dynamically based on results of computations and/or signal processing performed by the CSP 410); (9) outputting the raw outbound pulse $CP'_l$ to the pulse operations circuitry 358; (10) outputting $results_l$ to the I/O manager.

Figure 5:
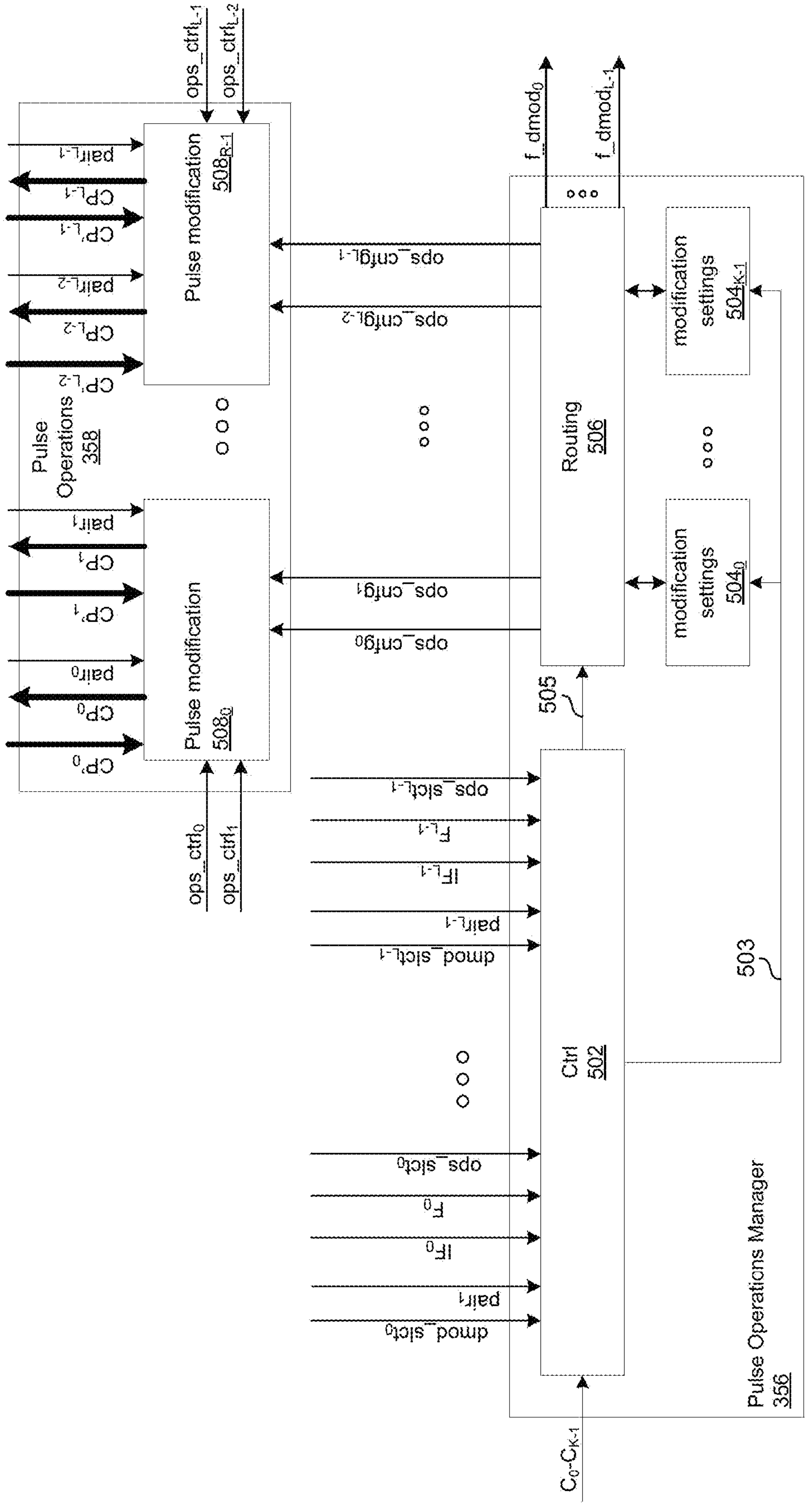
FIG. 5 shows an example implementation of the pulse operations manager and pulse operations circuitry of FIG. 3B

FIG. 5 shows an example implementation of the pulse operations manager and pulse operations circuitry of FIG. 3B. The pulse operations circuitry 358 comprises a plurality of pulse modification circuits $\mathbf{508}_0$-$\mathbf{508}_{R-1}$ (R is an integer≥1 in general, and R=L/2 in the example shown). The pulse operations manager 356 comprises control circuitry 502, routing circuitry 506, and a plurality of modification settings circuits $\mathbf{504}_0$-$\mathbf{504}_{K-1}$.

Although the example implementation has a 1-to-2 correspondence between pulse modification circuits $\mathbf{508}_0$-$\mathbf{508}_{R-1}$ and pulser circuits $\mathbf{302}_0$-$\mathbf{302}_{L-1}$, that does not need to be the case. In other implementations there may be fewer pulse modification circuits 508 than pulser circuits 302. Similarly, other implementations may comprise more pulse modification circuits 508 than pulser circuits 302.

As an example, in some instances two of the pulsers $\mathbf{302}_0$-$\mathbf{302}_{L-1}$ may generate two raw outbound pulses which are a phase-quadrature pulse pair. For example, assuming $CP_1$ and $CP_2$ are a phase-quadrature pulse pair to be output on path $\mathbf{313}_3$. In this example, pulse operations circuitry 358 may process $CP_1$ and $CP_2$ by multiplying a vector representation of $CP'_1$ and $CP'_2$ by one or more 2 by 2 matrices to: (1) perform single-sideband-modulation, as given by $$\begin{pmatrix} CP_1 \\ CP_2 \end{pmatrix} = \begin{pmatrix} \cos(\omega * \text{time\_stamp} & -\sin(\omega * \text{time\_stamp}) \\ \sin(\omega * \text{time\_stamp} & \cos(\omega * \text{time\_stamp}) \end{pmatrix} \begin{pmatrix} CP'_1 \\ CP'_2 \end{pmatrix},$$

where ω is the frequency of the single side band modulation and time_stamp is the time passed since the reference time (e.g. the beginning of a certain control protocol); (2) keep track of frame-of-reference rotations, as given by $$\begin{pmatrix} CP_1 \\ CP_2 \end{pmatrix} = \begin{pmatrix} \cos(\phi) & -\sin(\phi) \\ \sin(\phi) & \cos(\phi) \end{pmatrix} \begin{pmatrix} CP'_1 \\ CP'_2 \end{pmatrix},$$

where ϕ is the total phase that the frame of reference accumulated since the reference time; and/or (3) perform an IQ-mixer correction $$\begin{pmatrix} CP_1 \\ CP_2 \end{pmatrix} = \begin{pmatrix} C_{00} & C_{01} \\ C_{10} & C_{11} \end{pmatrix} \begin{pmatrix} CP'_1 \\ CP'_2 \end{pmatrix},$$

where $C_{00}$, $C_{01}$, $C_{10}$, and $C_{11}$ are the elements of a matrix that corrects for IQ-mixer imperfections. In an example implementation, each modification settings circuit, $\mathbf{504}_k$, contains registers that contain the matrix elements of three matrices:

$$C_k = \begin{pmatrix} C_{k00} & C_{k01} \\ C_{k10} & C_{k11} \end{pmatrix},$$

an IQ-mixer correction matrix;

$$S_k = \begin{pmatrix} \cos(\omega_k * \text{time\_stamp} & -\sin(\omega_k * \text{time\_stamp}) \\ \sin(\omega_k * \text{time\_stamp} & \cos(\omega_k * \text{time\_stamp}) \end{pmatrix},$$

a single side band frequency modulation matrix; and $$F_k = \begin{pmatrix} cos(\phi_k) & -sin(\phi_k) \\ \sin(\phi_k) & \cos(\phi_k) \end{pmatrix},$$

a frame rotation matrix, which rotates the IQ axes around the axis perpendicular to the IQ plane (i.e. the z-axis if I and Q are the x-axis and y-axis). In an example implementation, each modification settings circuit $\mathbf{504}_k$ also contains registers that contain the elements of the matrix products $C_kS_kF_k$ and $S_kF_k$.

In the example shown, each pulse modification circuit $\mathbf{508}_r$ is operable to process two raw outbound pulses $CP'_{2r}$ and $CP'_{2r+1}$ according to: the modification settings $ops\_cnfg_{2r}$ and $ops\_cnfg_{2r+1}$; the signals $ops\_ctrl_{2r}$ and $ops\_ctrl_{2r+1}$; and the signals $pair_{2r}$ and $pair_{2r+1}$. In an example implementation $pair_{2r}$ and $pair_{2r+1}$ may be communicated as $ops\_ctrl_{2r}$ and $ops\_ctrl_{2r+1}$. The result of the processing is outbound pulses $CP_{2r}$ and $CP_{2r+1}$. Such processing may comprise adjusting a phase, frequency, and/or amplitude of the raw outbound pulses $CP'_{2r}$ and $CP'_{2r+1}$. In an example implementation, $ops\_cnfg_{2r}$ and $ops\_cnfg_{2r+1}$ are in the form of a matrix comprising real and/or complex numbers and the processing comprises matrix multiplication involving a matrix representation of the raw outbound pulses $CP_{2r}$ and $CP_{2r+1}$ and the $ops\_cnfg_{2r}$ and $ops\_cnfg_{2r+1}$ matrix. One example of such an embodiment is described below with reference to FIG. 7.

The control circuitry 502 is operable to exchange information with the pulser circuits $\mathbf{302}_0$-$\mathbf{302}_{L-1}$ to generate values of $ops\_confg_0$-$ops\_confg_{L-1}$ and $f\_demod_0$-$f\_demod_{L-1}$ by controlling routing circuitry 506 based on signals $ops\_slct_0$-$ops\_slct_{L-1}$ and $dmod\_slct_0$-$dmod\_slct_{L-1}$, and by updating pulse modification settings $\mathbf{504}_0$-$\mathbf{504}_{K-1}$ based on $IF_0$-$IF_{L-1}$ and $F_0$-$F_{L-1}$ such that pulse modification settings output to pulse operations circuitry 358 are specifically tailored to each raw outbound pulse (e.g., to which quantum element 222 the pulse is destined, to which signal path 313 the pulse is destined, etc.) to be processed by pulse operations circuitry 358.

Each modification settings circuit 504$_k$ comprises circuitry operable to store modification settings for later retrieval and communication to the pulse operations circuitry 358. The modification settings stored in each modification settings circuit 504$_k$ may be in the form of one or more two-dimensional complex-valued matrices. Each signal path 313$_0$-313$_{K-1}$ may have particular characteristics (e.g., non-idealities of interconnect, mixers, switches, attenuators, amplifiers, and/or circuits along the paths) to be accounted for by the pulse modification operations. Similarly, each quantum element 122$_0$-122$_k$ may have a particular characteristics (e.g. resonance frequency, frame of reference, etc.). In an example implementation, the number of pulse modification settings, K, stored in the circuits 504 corresponds to the number of quantum element 122$_0$-122$_{K-1}$ and of signal paths 313$_0$-313$_{K-1}$ such that each of the modification settings circuits 504$_0$-504$_{K-1}$ stores modification settings for a respective one of the quantum elements 122$_0$-122$_{K-1}$ and/or paths 313$_0$-313$_{K-1}$. In other implementations, there may be more or fewer pulse modification circuits 504 than signal paths 313 and more or fewer pulse modification circuits 504 than quantum elements 122 and more or fewer signal paths 313 than quantum elements 122.

The routing circuitry 506 is operable to route modification settings from the modification settings circuits 504$_0$-504$_{L-1}$ to the pulse operations circuit 358 (as ops_confg$_0$-ops_confg$_{L-1}$) and to the pulsers 302$_0$-302$_{L-1}$ (as f_dmod$_0$-f_dmod$_{L-1}$). In the example implementation shown, which of the modification settings circuits 504$_0$-504$_{K-1}$ has its/their contents sent to which of the pulse modification circuits 508$_0$-508$_{R-1}$ and to which of the pulsers 302$_0$-302$_{L-1}$ is controlled by the signals "route" from the control circuitry 502.

The signal ops_slct$_l$ informs the pulse operations manager 356 as to which modification settings 504$_k$ to send to the pulse modification circuit 508$_l$. The pulser 302$_l$ may determine ops_slct$_l$ based on the particular quantum element 122$_k$ and/or signal path 313$_k$ to which the pulse is to be transmitted (e.g., the resonant frequency of the quantum element, frame of reference, and/or mixer correction). The determination of which quantum element and/or signal path to which a particular pulser 302$_l$ is to send an outbound pulse at a particular time may be predetermined in the quantum algorithm description or may be determined based on calculations performed by the pulser 302$_l$ and/or others of the pulsers 302$_0$-302$_{L-1}$ during runtime. The control circuitry 502 may then use this information to configure the routing block 506 such that the correct modification settings are routed to the correct one of the pulse modification circuits 508$_0$-508$_{L-1}$.

In an example implementation, the digital signal IF$_l$ instructs the pulse operations manager 356 to update a frequency setting of the modification settings circuit 504$_k$ indicated by ops_slct$_l$. In an example implementation, the frequency setting is the matrix S$_k$ (described above) and the signal IF$_l$ carries new values indicating the new $\omega_k$ to be used in the elements of the matrix S$_k$. The new values may, for example, be determined during a calibration routine (e.g., performed as an initial portion of the quantum algorithm) in which one or more of the pulsers 302$_0$-302$_{L-1}$ sends a series of outbound pulses CP, each at a different carrier frequency, and then measures the corresponding inbound signals AI.

In an example implementation, the signal F$_l$ instructs the pulse operations manager 356 to update a frame setting of the modification settings circuit 504$_k$ indicated by ops_slct$_l$. In an example implementation, the frame setting is the matrix F$_k$ (described above) and the signal F$_l$ carries a rotation matrix F$_l$ which multiplies with F$_k$ to rotate F$_k$. This can be written as $$F_k = F_l F_k = \begin{pmatrix} \cos(\Delta\phi) & -\sin(\Delta\phi) \\ \sin(\Delta\phi) & \cos(\Delta\phi) \end{pmatrix} \begin{pmatrix} \cos(\phi_k) & -\sin(\phi_k) \\ \sin(\phi_k) & \cos(\phi_k) \end{pmatrix} = \begin{pmatrix} \cos(\phi_k + \Delta\phi) & -\sin(\phi_k + \Delta\phi) \\ \sin(\phi_k + \Delta\phi) & \cos(\phi_k + \Delta\phi) \end{pmatrix},$$

where $\phi_k$ is the frame of reference before the rotation and $\Delta\phi$ is the amount by which to rotate the frame of reference. The pulser 302$_l$ may determine $\Delta\phi$ based on a predetermined algorithm or based on calculations performed by the pulsers 302$_l$ and/or others of the pulsers 302$_0$-302$_{L-1}$ during runtime.

In an example implementation, the signal dmod_sclt$_l$ informs the pulse operations manager 356 from which of the modification settings circuits 504$_k$ to retrieve values to be sent to pulser 302$_l$ as f_dmod$_l$. The pulser 302$_l$ may determine dmod_sclt$_l$ based on the particular quantum element 122$_k$ and/or signal path 315$_k$ from which the pulse to be processed arrived. The determination of from which quantum element and/or signal path a particular pulser 302$_l$ is to process an inbound pulse at a particular time may be predetermined in the quantum algorithm description or may be determined based on calculations performed by the pulser 302$_l$ and/or others of the pulsers 302$_0$-302$_{L-1}$ during runtime. The control circuitry 502 may then use this information to configure the routing block 506 such that the correct modification settings are routed to the correct one of the pulsers 302$_0$-302$_{L-1}$. For example, when pulse generation circuit 302$_l$ needs to demodulate a pulse signal AI$_l$ from quantum element 122$_k$, it will send a dmod_sclt$_l$ signal instructing the pulse operation manager 356 to rout the element SF$_{k00}$=cos($\omega_k$*time_stamp+$\phi_k$) from modification settings circuit 504$_k$ to pulser 302$_l$ (as f_dmod$_l$).

In the example implementation shown, the digital signals C$_0$-C$_{K-1}$ provide information about signal-path-specific modification settings to be used for each of the signal paths 313$_0$-313$_{K-1}$. For example, each signal C$_k$ may comprise a matrix to be multiplied by a matrix representation of a raw outbound pulse CP'$_l$ such that the resulting output outbound pulse is pre-compensated for errors (e.g., resulting from imperfections in mixers, amplifiers, wiring, etc.) introduced as the outbound pulse propagates along signal path 313$_k$. The result of the pre-compensation is that output outbound pulse CP$_l$ will have the proper characteristics upon arriving at the quantum processor 218. The signals C$_0$-C$_{K-1}$ may, for example, be calculated by the quantum controller 210 itself, by the programming subsystem 202, and/or by external calibration equipment and provided via I/O manager 368. The calculation of signals may be done as part of a calibration routine which may be performed before a quantum algorithm and/or may be determined/adapted in real-time as part of a quantum algorithm (e.g., to compensate for temperature changes during the quantum algorithm).

Figure 6:
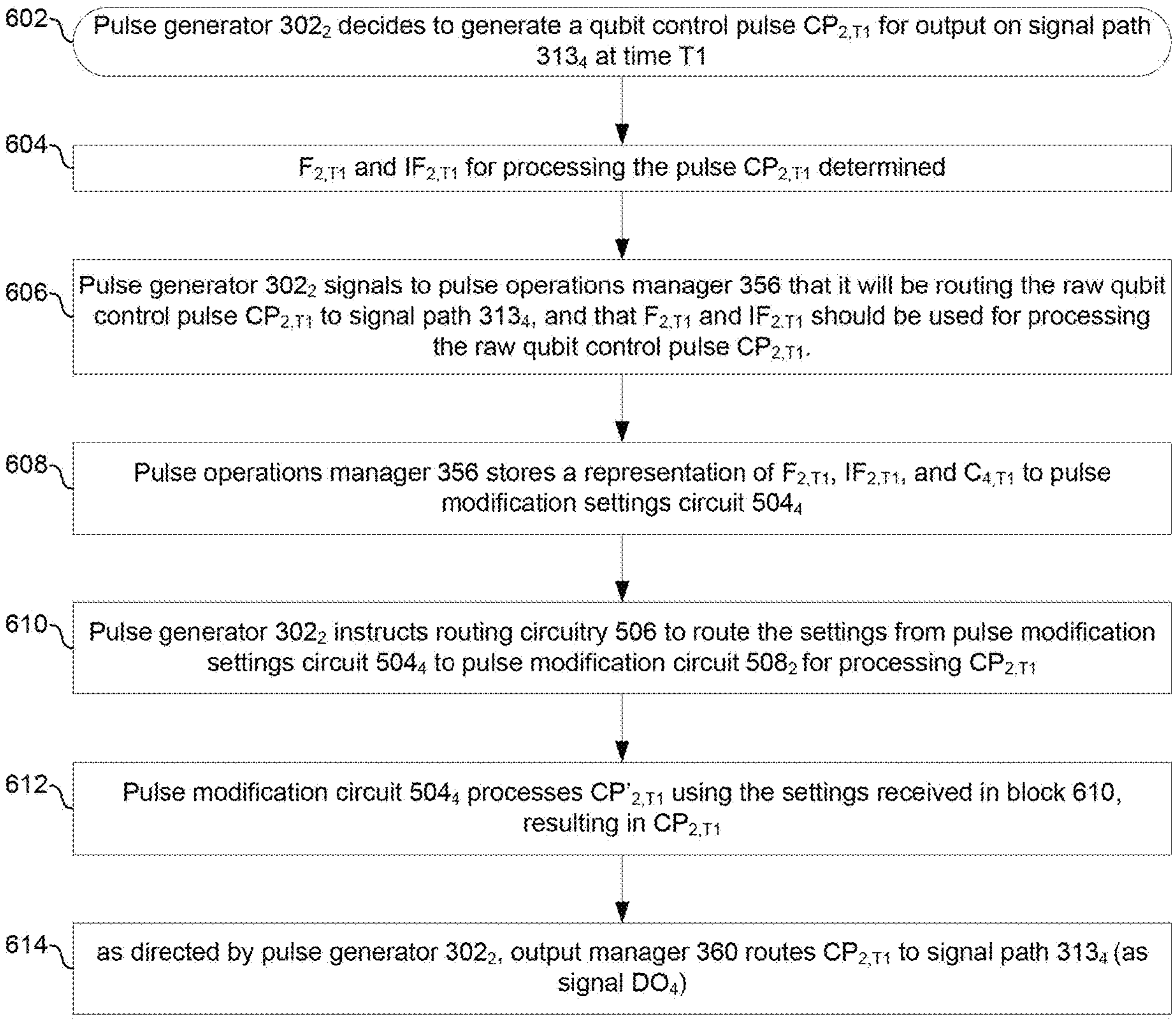
FIG. 6 is a flowchart illustrating an example operation of a quantum controller in accordance with an example implementation of this disclosure.

FIG. 6 is a flowchart illustrating an example operation of a quantum controller in accordance with an example implementation of this disclosure.

The process begins with block 602 in which pulser 302$_2$ decides to generate a raw outbound pulse CP'$_{2,T1}$ to be output on signal path 313$_4$ at time T1. The decision is based on instructions loaded in memory 402 and may take into account the result of computations performed by the CSP 410 of the pulser 302$_2$ and/or CSP 410 of another of the pulsers $\mathbf{302}_0$-$\mathbf{302}_{L-1}$ (e.g., based on an inbound quantum element readout signal $AI_2$ demodulated by a CSP 410).

In block 604, pulser $\mathbf{302}_2$ signals to pulse operations manager 356, via signal $ops\_slct_2$, that it wants the raw outbound pulse $CP'_{2,T1}$ to be modified with pulse modification settings stored in $\mathbf{504}_4$.

In block 606, pulse modification manager 356 routes the settings from pulse modification settings circuit $\mathbf{504}_4$ to pulse modification circuit $\mathbf{508}_2$.

In block 608, pulse modification circuit $\mathbf{508}_2$ processes $CP'_{2,T1}$ using the settings received in block 606. The result is output outbound quantum pulse $CP_{2,T1}$.

In block 610, as directed by pulser $\mathbf{302}_2$, output manager 360 routes $CP_{2,T1}$ to signal path $\mathbf{313}_4$ (as signal $DO_4$).

In block 612, pulser $\mathbf{302}_2$ decides to generate a raw outbound pulse $CP'_{2,T2}$ to be output on signal path $\mathbf{313}_7$ at time T2. The decision is based on instructions loaded in memory 402 and may take into account the result of computations performed by the CSP 410 of the pulser $\mathbf{302}_2$ and/or CSP 410 of another of the pulsers $\mathbf{302}_0$-$\mathbf{302}_{L-1}$ (e.g., based on an inbound quantum element readout signal $AI_2$ demodulated by a CSP 410).

In block 614, pulser $\mathbf{302}_2$ signals to pulse operations manager 356, via signal $ops\_slct_2$, that it wants to modify raw outbound pulse $CP'_{2,T2}$ with pulse modification settings stored in $\mathbf{504}_7$.

In block 616, pulse modification manager 356 routes the settings from pulse modification settings circuit $\mathbf{504}_7$ to pulse modification circuit $\mathbf{508}_2$.

In block 618, pulse modification circuit $\mathbf{508}_2$ processes $CP'_{2,T2}$ using the settings received in block 616. The result is output outbound quantum pulse $CP_{2,T2}$.

In block 620, as directed by pulser $\mathbf{302}_2$, output manager 360 routes $CP_{2,T2}$ to signal path $\mathbf{313}_7$ (as signal $DO_7$).

Thus, at different times during runtime of a single quantum algorithm, a single pulser 302 generates pulses for two different paths (which may correspond to two different quantum elements 122 of the quantum processor 218, in this example), and each of the pulses receives different processing that is customized for its respective path and/or quantum element.

Figure 7A:
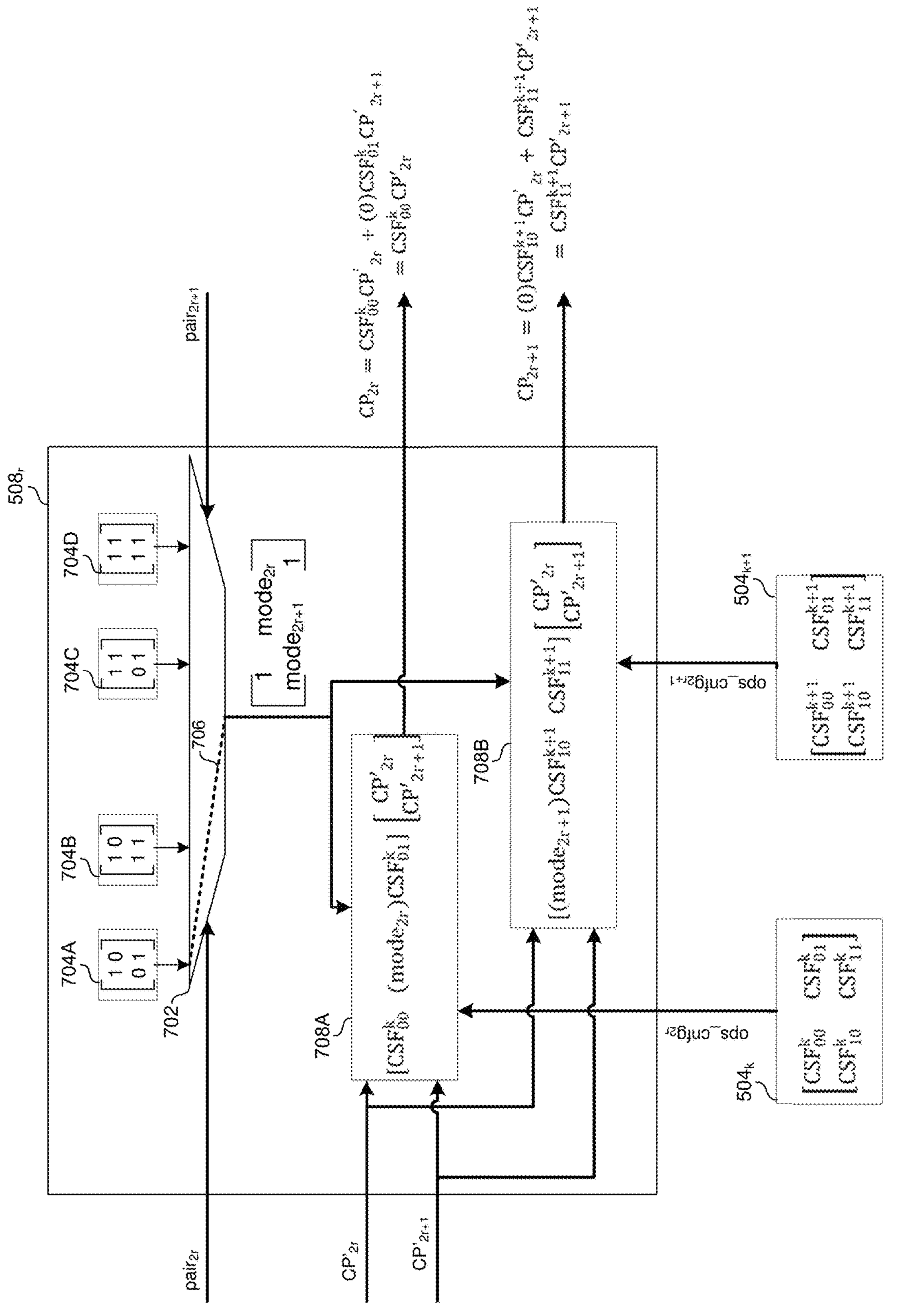
FIGS. 7A and 7B shows an example implementation of the pulse modification circuitry of FIG. 5.
Figure 7B:
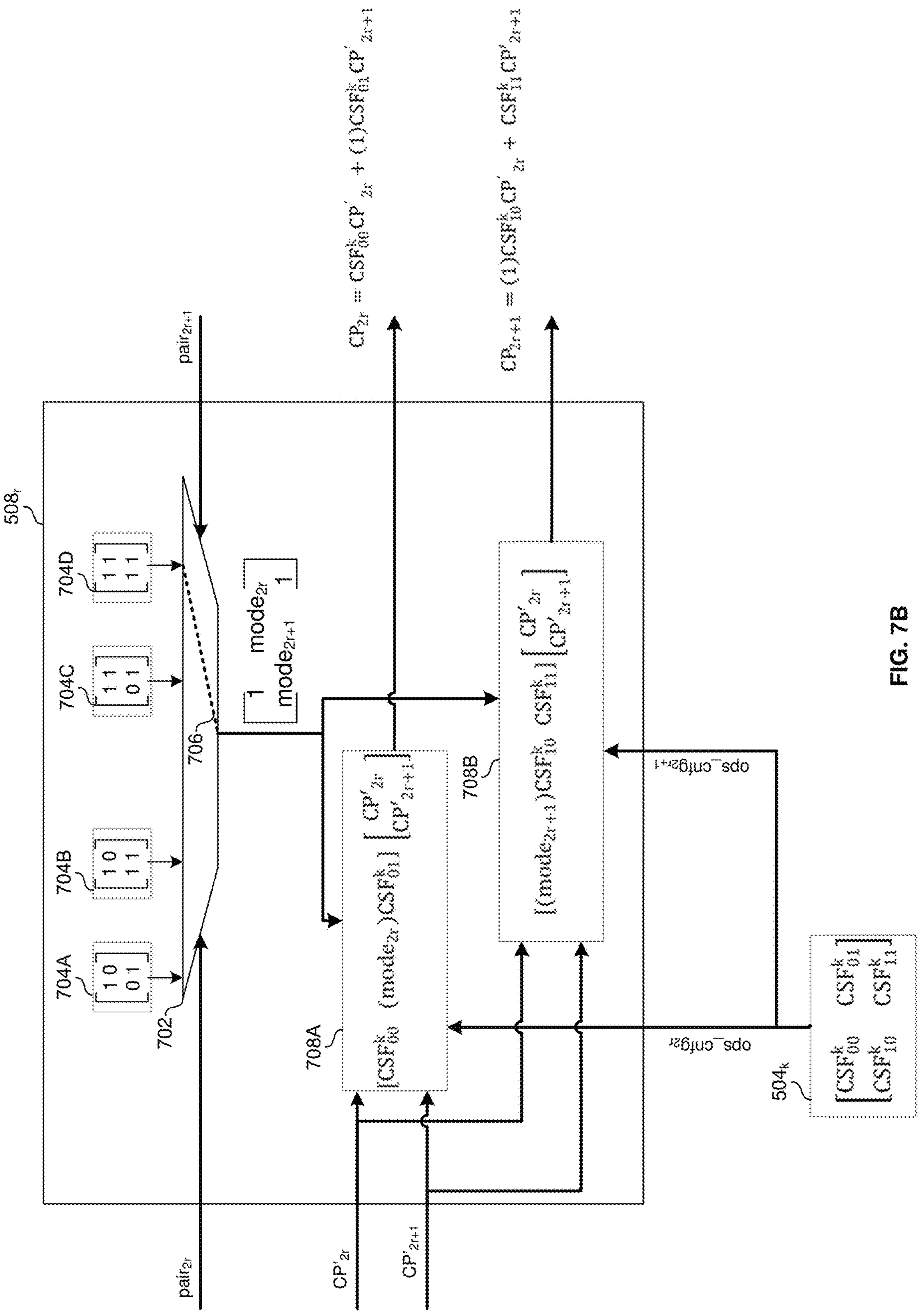

FIGS. 7A and 7B shows an example implementation of the pulse modification circuitry of FIG. 5. The example pulse modification circuitry $\mathbf{508}_r$ shown comprises mask select circuit 702 and pulse processing circuits 708A and 708B. Also shown are pulse modification settings circuits $\mathbf{504}_k$ and $\mathbf{504}_{k+1}$. Although the example pulse modification circuitry $\mathbf{508}_r$ is configured for processing two pulses as either independent pulses or a two-pulse pair, in other implementations the pulse modification circuitry $\mathbf{508}_r$ may be configured for processing 3 or more pulses (and may have correspondingly more pulse processing circuits 708).

In FIG. 7A, the pulse modification circuitry $\mathbf{508}_r$ is configured to process $CP'_{2r}$ and $CP'_{2r+1}$ as two independent pulses. The signals $pair_{2r}$ and $pair_{2r+1}$ select (as indicated by line 706) mask matrix $$[M]=\begin{bmatrix}1 & 0\\ 0 & 1\end{bmatrix}$$

for input to 708A and 708B, and the pulse operations manager 356 outputs (based on signals $ops\_slct_{2r}$, and $ops\_slct_{2r+1}$) $ops\_cnfg_{2r}$ from modification settings circuit $\mathbf{504}_k$ and $ops\_cnfg_{2r+1}$ from $\mathbf{504}_{k+1}$ (k and k+1 were chosen arbitrarily for illustration, but each of $ops\_cnfg_{2r}$ and $ops\_cnfg_{2r+1}$ could come from any of the modification settings circuit $\mathbf{504}_0$-$\mathbf{504}_{K-1}$). The result is that pulse processing circuit 708A outputs $CP_{2r}=CSF_{00}{}^{k}CP'_{2r}$, and pulse processing circuit 708B outputs $CP_{2r+1}=CSF_{11}{}^{k+1}CP'_{2+1}$. In the example implementation shown, values of the mask matrix [M] are either 0 or 1 and $mode_{2r}=pair_{2r}$ and $mode_{2r+1}=pair_{2r+1}$. In other implementations the mask matrix may comprise values other than 0 and 1 (e.g., real or complex values calculated to apply a desired gain and/or phase shift) and $mode_{2r}$ may be different than $pair_{2r}$ and/or $mode_{2r+1}$ may be different than $pair_{2r+1}$.

In FIG. 7B, the pulse modification circuitry $\mathbf{508}_r$ is configured to process $CP'_{2r}$ and $CP'_{2r+1}$ as a two-pulse pair. The signals $pair_{2r}$ and $pair_{2r+1}$ select (as indicated by line 706) mask matrix $$[M]=\begin{bmatrix}1 & 1\\ 1 & 1\end{bmatrix}$$

for input to 708A and 708B, and the pulse operations manager 356 outputs (based on signals $ops\_slct_{2r}$, and $ops\_slct_{2r+1}$) both $ops\_cnfg_{2r}$ and $ops\_cnfg_{2r+1}$ from $\mathbf{504}_k$ (both $ops\_cnfg_{2r}$ and $ops\_cnfg_{2r+1}$ coming from $\mathbf{504}_k$ was chosen arbitrarily for illustration, but $ops\_cnfg_{2r}$ could come from a different modification settings circuit than $ops\_cnfg_{2r+1}$). The result is that pulse processing circuit 708A outputs $CP_{2r}=CSF_{00}{}^{k}CP'_{2r}+CSF_{01}{}^{k}CP'_{2r+1}$, and pulse processing circuit 708B outputs $CP_{2r+1}=CSF_{10}{}^{k}CP'_{2r}+CSF_{11}{}^{k}CP'_{2r+1}$, which result in $$\begin{bmatrix}CP_{2r}\\ CP_{2r+1}\end{bmatrix}=\begin{bmatrix}CSF_{00}^{k} & CSF_{01}^{k}\\ CSF_{10}^{k} & CSF_{11}^{k}\end{bmatrix}\begin{bmatrix}CP'_{2r}\\ CP'_{2r+1}\end{bmatrix}.$$

In the example implementation shown, values of the mask matrix [M] are either 0 or 1 and $mode_{2r}=pair_{2r}$ and $mode_{2r+1}=par_{2r+1}$. In other implementations the mask matrix may comprise values other than 0 and 1 (e.g., real or complex values calculated to apply a desired gain and/or phase shift). Also, in other implementations, $mode_{2r}$ may be different than $pair_{2r}$ and/or $mode_{2r+1}$ may be different than $pair_{2r+1}$.

Figure 8A:
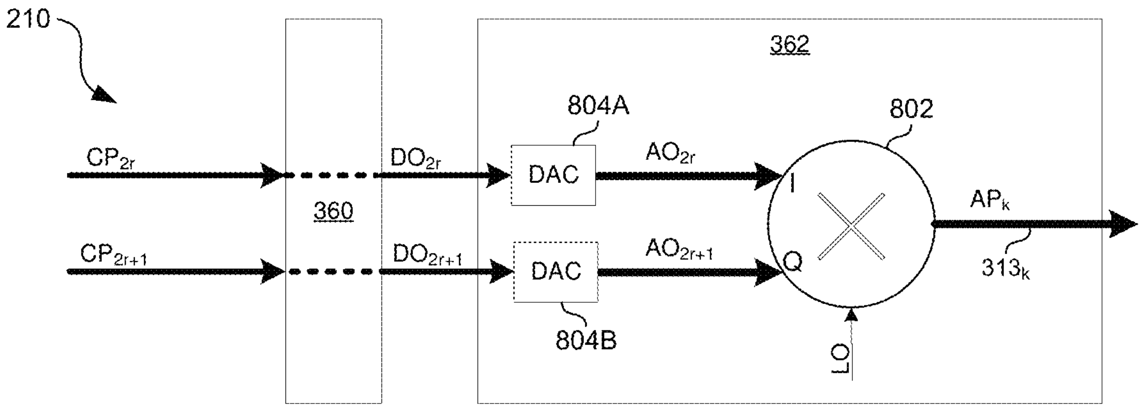
FIG. 8A shows a quantum controller outputting a two-pulse pair.

FIG. 8A shows a quantum controller outputting a two-pulse pair. In FIG. 8A, output outbound pulses $CP_{2r}$, and $CP_{2r+1}$ are a phase-quadrature pair, which are routed as signals $DO_{2r}$ and $DO_{2r+1}$ by output manager 360, converted to corresponding analog signals $AO_{2r}$ and $AO_{2r+1}$ by digital-to-analog converters 804A and 804B (which may be two DAC elements/channels of a single DAC) of transmit analog frontend 362, and then upconverted by quadrature mixer 802, resulting in an outbound pulse signal $AP_k$ output on signal path $\mathbf{313}_k$.

Figure 8B:
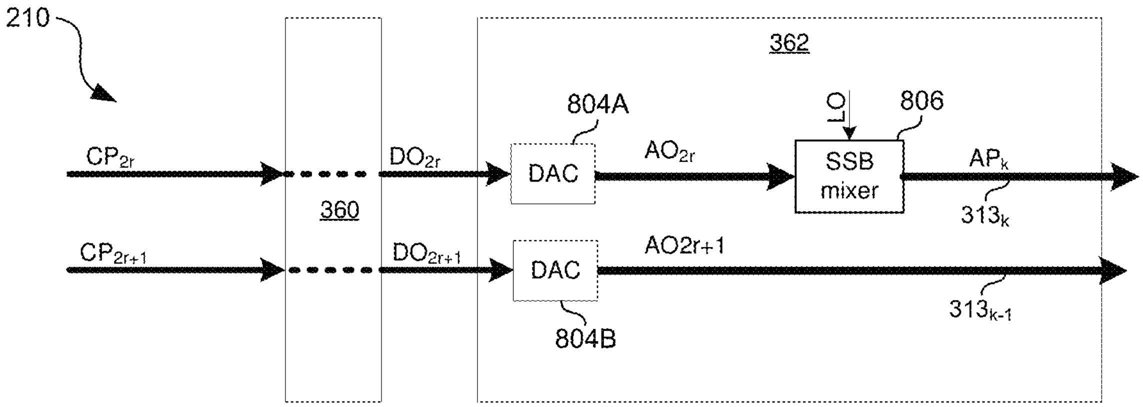
FIG. 8B shows a quantum controller outputting two independent pulses.

FIG. 8B shows a quantum controller outputting two independent pulses. In FIG. 8B, output outbound pulses $CP_{2r}$ and $CP_{2r+1}$ are two independent pulses, which are routed as signals $DO_{2r}$ and $DO_{2r+1}$ by output manager 360 and converted to corresponding analog signals $AO_{2r}$ and $AO_{2r+1}$ by digital-to-analog converters 804A and 804B of transmit analog frontend 362. The signal $AO_{2r}$ is then upconverted by single sideband mixer 806 to generate signal $AP_k$ output on signal path $\mathbf{313}_k$. The baseband signal $AO_{2r+1}$ is directly output (without upconversion) on signal path $\mathbf{313}_{k-1}$.

Figure 8C:
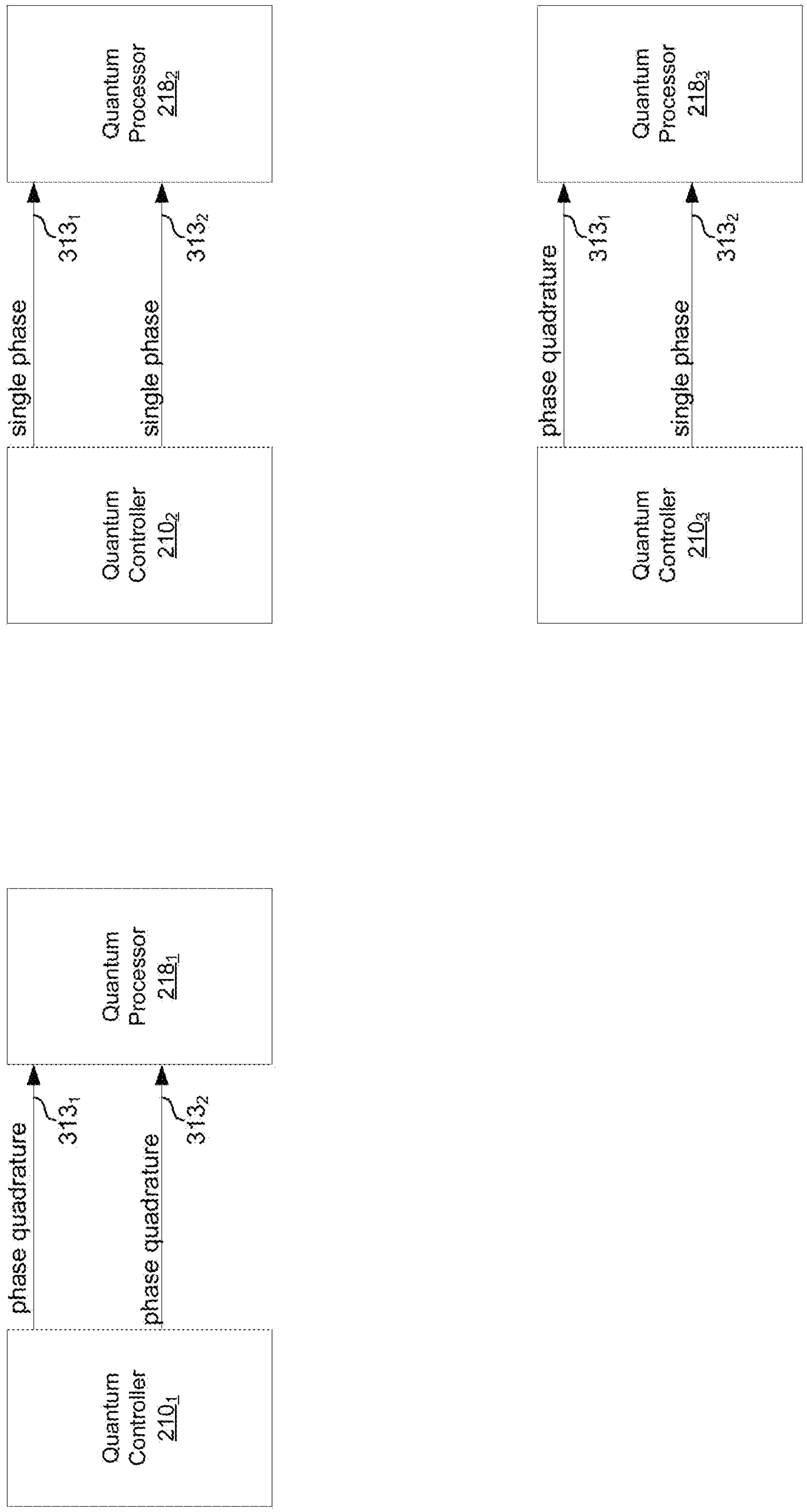
FIG. 8C shows a quantum controller in accordance with an example implementation of this disclosure interfacing with various quantum processors that use different signaling.

FIG. 8C shows three instances of the quantum controller 210 interfacing with three different quantum processors $218_1$, $218_2$, and $218_3$. The three quantum processors $218_1$, $218_2$, and $218_3$ may, for example, be different makes and/or models of processors. Alternatively, the three quantum processors $218_1$, $218_2$, and $218_3$ may be three differently-configured instances of the same quantum processor (e.g., each different configuration may be suited for carrying out different quantum algorithms). Alternatively, the three quantum processors $218_1$, $218_2$, and $218_3$ may be three differently-configured elements of the same quantum processor. Alternatively, the three quantum processors $218_1$, $218_2$, and $218_3$ may be the same element of the same processor but at different times (i.e., pair $313_1$ and $313_2$ dynamically switches from multi-pulse pair mode to independent pulses mode. Quantum processor $218_1$ requires pulses generated via a quadrature mixer, quantum processor $218_2$ requires pulses generated via single-phase mixer or with no mixing at all (as baseband signals), and quantum processor $218_3$ requires pulses generated via a quadrature mixer on signal path $313_1$ and pulses generated via a single-phase mixer or with no mixing at all (as baseband signals) on signal path $313_2$.

FIGS. 8A-8C illustrate the flexibility of the quantum controller 210 to interact with different quantum processors (or different qubits/resonators of a single quantum processor) that use different signaling schemes. The quantum controller 210 is operable to output independent pulses during some time intervals and output multi-pulse sets during the same and/or other time intervals. The quantum controller 210 may be operable to output independent outbound pulses onto a particular signal path $313_k$ during one time interval and output multi-pulse sets onto the same signal path $313_k$ during a different time interval. The quantum controller 210 may be operable to output one or more independent pulses on one or more of signal paths $313_0$-$313_{K-1}$ while concurrently outputting one or more multi-pulse sets on one or more others of signal paths $313_0$-$313_{K-1}$. Independent pulses output by the quantum controller 210 may be baseband, IF, or RF signals as necessary or desired.

Figure 9:
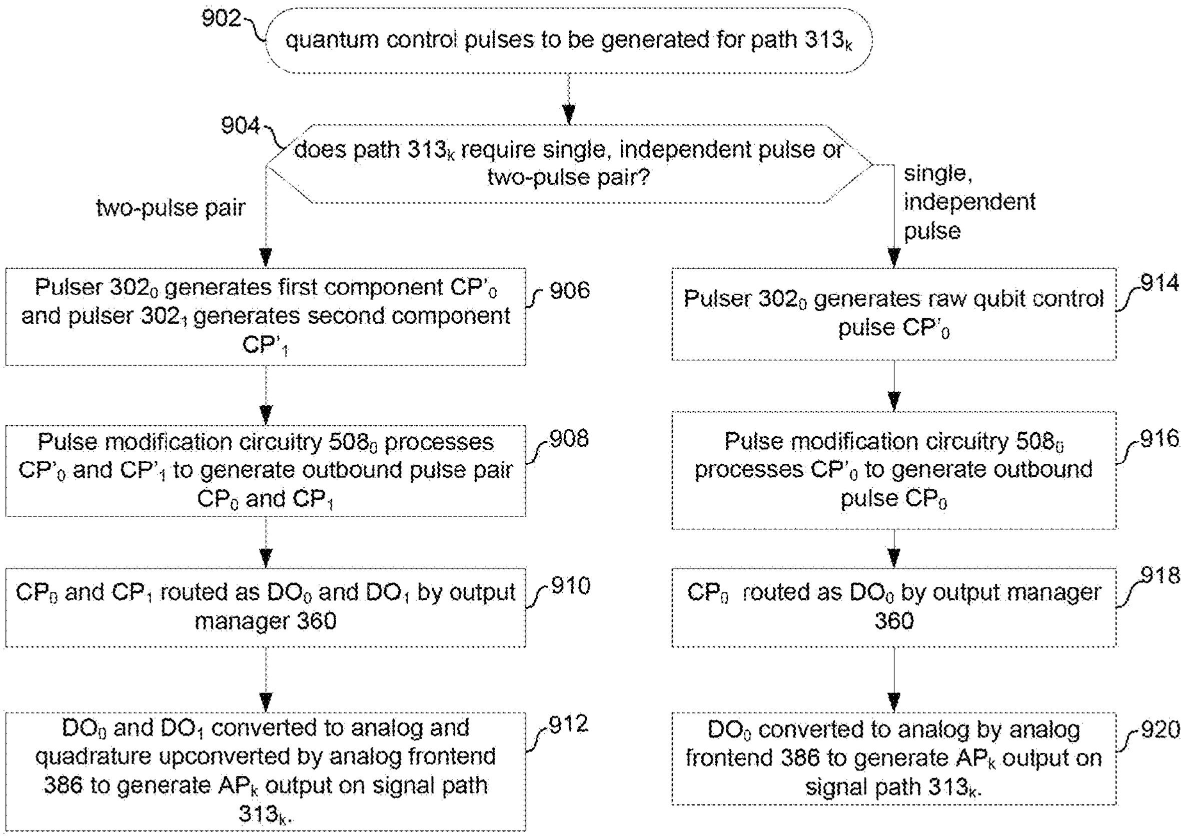
FIG. 9 is a flowchart illustrating operation of a quantum controller in accordance with an example implementation of this disclosure.

FIG. 9 is a flowchart illustrating operation of a quantum controller in accordance with an example implementation of this disclosure. The process begins with block 902 in which the quantum controller determines (based on instructions of a quantum algorithm being carried out and on calculations performed by one or more pulsers 302) that an outbound pulse is to be generated for output on signal path $313_k$. For purposes of illustration pulsers $302_0$ and $302_1$ are arbitrarily chosen as the pulsers involved in the process and pulse modification circuitry $508_0$ is arbitrarily chosen as the pulse modification circuitry involved in the process, but in practice it could be any two of pulsers $302_0$-$302_{L-1}$ and any of pulse modification circuits $508_0$-$508_{L-1}$.

In block 904, the quantum controller 210 determines whether the outbound pulse should be an independent pulse or a multi-pulse set (a two-pulse pair, in the example). This determination may, for example, be based on whether path $313_k$ connects to a qubit or to a readout resonator. This determination may, for example, be based on a particular quantum processor 218 connected to the quantum controller 210 (which may, for example, be specified in the quantum algorithm description or may be discovered during a discovery/calibration process between the quantum controller 210 and the quantum processor 218). If the pulse is to be a two-pulse pair, then the process advances to block 906.

In block 906, pulser $302_0$ generates raw outbound pulse $CP'_0$ which is an first component of the two-pulse pair, and pulser $302_1$ generates raw outbound pulse $CP'_1$ which is a second component of the two-pulse pair.

In block 908, pulse modification circuitry $508_0$ processes $CP'_0$ and $CP'_1$ to generate outbound two-pulse pair $CP_0$ and $CP_1$.

In block 910, $CP_0$ and $CP_1$ routed as $DO_0$ and $DO_1$ by output manager 360.

In block 912, the signals $DO_0$ and $DO_1$ are converted to analog and quadrature upconverted by analog frontend 362 to generate the signal $AP_k$ which is output to quantum processor 218 on signal path $313_k$.

Returning to block 904, if the pulse is to be a single, independent pulse, then the process advances to block 914.

In block 914, pulser $302_0$ generates independent raw outbound pulse $CP'_0$.

In block 916, pulse modification circuitry $508_0$ processes $CP'_0$ to generate outbound pulse $CP_0$.

In block 918, $CP_0$ routed as signal $DO_0$ by output manager 360.

In block 920, the signal $DO_0$ is upconverted by analog frontend 386 to generate $AP_k$, which is output to the quantum processor on signal path $313_k$.

The process of FIG. 9 may be repeated for each outbound pulse to be generated. For example, during a first set of one or more instructions of the quantum algorithm description a pulse may be generated for path $313_4$ and which requires a pulse pair and during a second set of one or more instructions of the quantum algorithm description a pulse may be generated for path $313_7$ which requires a single-phase pulse. In this example, the process may proceed through blocks 906-912 during the first set of one or more instructions and through blocks 914-920 during the second set of one or more instructions.

In accordance with an example implementation of this disclosure, a quantum controller (e.g., 210) comprises a first raw outbound quantum control pulse generation circuit (e.g., $302_0$), a second raw outbound quantum control pulse generation circuit (e.g., $302_1$), and an outbound quantum control pulse modification circuit (e.g., 356 and 358). The first outbound quantum control pulse generation circuit is operable to generate a first raw outbound quantum control pulse (e.g., $CP'_{0,T1}$). The second raw outbound quantum control pulse generation circuit is operable to generate a second raw outbound quantum control pulse (e.g., $CP'_{1,T1}$). The outbound quantum control pulse modification circuit is operable to dynamically determine (i.e., during runtime of a quantum algorithm) whether to process the first raw outbound quantum control pulse and the second raw outbound quantum control pulse as a multi-pulse pair to be mixed together (via multiplication of vector representations of the pulses by a matrix having non-zero, off-diagonal elements) or as two independent pulses. The determination of whether to process the first raw outbound quantum control pulse and the second raw outbound quantum control pulse as a multi-pulse pair to be mixed together or as two independent pulses may be based on to which one or more signal path(s) (e.g., $313_k$) and/or one or more quantum element(s) (e.g., $122_k$) the first raw outbound quantum control pulse and the second raw outbound quantum control pulse are to be routed. The outbound quantum control pulse modification circuit may be operable to, when the first raw outbound quantum control pulse and the second raw outbound quantum control pulse are to be processed as a multi-pulse pair, determine a N×N (N being an integer) matrix representation of the signal path(s) and/or quantum element(s) to which the generated outbound quantum control pulse is to be output and mix the multi-pulse pair using the N×N matrix and a N×1 matrix representation of the first raw outbound quantum control pulse and the second raw outbound quantum control pulse.

The first outbound quantum control pulse generation circuit may comprise pulse memory (e.g., 404) configured to store pulse templates comprising one or more samples. Generation of the first raw outbound quantum control pulse may comprises a retrieval of one of the pulse templates from the pulse memory, and a manipulation (e.g., scaling and/or decompressing) of the samples of the pulse template. The outbound quantum control pulse modification circuit may be operable to store a plurality of pulse modification settings (e.g., in $\mathbf{504}_0$-$\mathbf{504}_{K-1}$). The outbound quantum control pulse modification circuit may be dynamically configurable such that which of the plurality of pulse modifications settings is applied to the first raw outbound quantum control pulse and which of the plurality of pulse modification settings is applied to the second raw outbound quantum control pulse is selectable during execution of instructions of a quantum computing algorithm by the quantum controller. Each pulse modification setting of the plurality of pulse modification settings may be configured for use with a respective signal path and/or quantum element of the plurality of signal paths and/or quantum elements (e.g., a first setting for a first quantum element $\mathbf{122}_k$ and/or signal path $\mathbf{313}_k$, a second setting for a second quantum element $\mathbf{122}_k$ and/or signal path $\mathbf{313}_k$, a third setting for a first quantum transition, and so on). Each pulse modification setting of the plurality of pulse modification settings may be a N by N matrix of real or complex numbers (including zero). The pulse modification circuit may be operable to, in instances that the first raw outbound quantum control pulse and the second raw outbound quantum control pulse are to be processed as two independent pulses, process the first raw outbound quantum control pulse using a first pulse modification setting (e.g., stored in $\mathbf{504}_1$) to compensate for errors that will be introduced by a first signal path (e.g., $\mathbf{313}_1$) and process the second raw outbound quantum control pulse using a second pulse modification setting (e.g., stored in $\mathbf{504}_2$) to compensate for errors that will be introduced by a second signal path (e.g., $\mathbf{313}_2$). The pulse modification circuit may be operable to, in instances that the first raw outbound quantum control pulse and the second raw outbound quantum control pulse are to be processed as two independent pulses, process the first raw outbound quantum control pulse using a first pulse modification setting (e.g., stored in $\mathbf{504}_1$) to perform frequency modulation (e.g., I/Q modulation or single-sideband modulation), phase modulation, and/or frame rotation corresponding to the quantum element (or transition) to which the pulse is directed to (e.g. $\mathbf{122}_1$) and process the second raw outbound quantum control pulse using a second pulse modification setting (e.g., stored in $\mathbf{504}_2$) to perform frequency modulation and/or frame rotation corresponding to the quantum element (or transition) to which the pulse is directed to (e.g. $\mathbf{122}_2$). The pulse modification circuit may be operable to, in instances that the first raw outbound quantum control pulse and the second raw outbound quantum control pulse are to be processed as a multi-pulse pair, process the first raw outbound quantum control pulse and the second raw outbound quantum control pulse using a third pulse modification setting (e.g., stored in $\mathbf{504}_3$) to compensate for errors introduced by a third one or more signal paths (e.g., $\mathbf{313}_3$). The pulse modification circuit may be operable to, in instances that the first raw outbound quantum control pulse and the second raw outbound quantum control pulse are to be processed as a multi-pulse pair, process the first raw outbound quantum control pulse and the second raw outbound quantum control pulse using a third pulse modification setting (e.g., stored in $\mathbf{504}_3$) to perform frequency modulation (e.g., I/Q modulation or single sideband modulation), phase modulation, frame rotation, and/or any linear transformation (i.e. multiplying the vector representation of the pulses by any general matrix). The modulation, frame rotation, and/or linear transformation may be determined based on the to the quantum element (or transition) and/or path to which the pulse is directed to (e.g. $\mathbf{122}_3$).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure. As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:

a waveform source, wherein a waveform comprises a plurality of pulses of electromagnetic waves;

a waveform generator operably coupled to the waveform source;

a digital-to-analog converter operably coupled to the waveform generator to generate an analog output; and a manager adapted to control the waveform generator, wherein:

the manager comprises an instruction memory configured to store instructions, the manager comprises an instruction interpreter configured to sequentially execute the instructions, and the manager is configured to determine a coupling of the analog output to one or more quantum elements of a plurality of quantum elements.

2. The system of claim 1, wherein the system comprises a mixing circuit operably coupled to at least one quantum element of the plurality of quantum elements.

3. The system of claim 1, wherein the manager is software programmable.

4. The system of claim 1, wherein the waveform generator comprises a routing circuit operable to route signals between a mixing circuit and the plurality of quantum elements.

5. The system of claim 4, wherein the routing circuit is configured to route the signals according to one or more characteristics of return pulses from a pulse-controlled system.

6. The system of claim 1, wherein the waveform generator is operably coupled to a pulse-controlled system.

7. The system of claim 6, wherein the pulse-controlled system is a quantum system comprising one or more quantum elements.

8. The system of claim 1, wherein the system comprises a pulse modification circuit operable to pre-compensate for errors introduced by a signal path.

9. The system of claim 1, wherein the system comprises a pulse modification circuit operable to process a plurality of pulse outputs and a mixed signal output.

10. The system of claim 1, wherein the system comprises a pulse modification circuit operable to pre-compensate for errors introduced by a mixing circuit.

11. A method comprising:

generating a waveform, comprising a plurality of pulses of electromagnetic waves, via a waveform source and a waveform generator;

converting the generated waveform into an analog output via a digital-to-analog converter operably coupled to the waveform generator; and controlling the waveform generator by sequentially interpreting instructions, via a manager, wherein the manager is configured to determine a coupling of the analog output to one or more quantum elements of a plurality of quantum elements.

12. The method of claim 11, wherein the method comprises mixing the analog output.

13. The method of claim 11, wherein the manager is software programmable.

14. The method of claim 11, wherein the method comprises routing signals between a mixing circuit and the plurality of quantum elements.

15. The method of claim 11, wherein the method comprises routing signals according to one or more characteristics of return pulses from a pulse-controlled system.

16. The method of claim 11, wherein the waveform generator is operably coupled to a pulse-controlled system.

17. The method of claim 16, wherein the pulse-controlled system is a quantum system comprising one or more quantum elements.

18. The method of claim 11, wherein the method comprises pre-compensating for errors introduced by a signal path.

19. The method of claim 11, wherein the method comprises processing a plurality of pulse outputs and a mixed signal output.

20. The method of claim 11, wherein the method comprises pre-compensating for errors introduced by a mixing circuit.

* * * * *